United States Patent [19]

Giomi

[11] Patent Number: 5,774,370
[45] Date of Patent: Jun. 30, 1998

[54] METHOD OF EXTRACTING IMPLICIT SEQUENTIAL BEHAVIOR FROM HARDWARE DESCRIPTION LANGUAGES

[75] Inventor: Jean-Charles Giomi, Woodside, Calif.

[73] Assignee: VLSI Technology, Inc., San Jose, Calif.

[21] Appl. No.: 531,996

[22] Filed: Sep. 18, 1995

[51] Int. Cl.⁶ .................................................. G06F 17/50
[52] U.S. Cl. .......................................... 364/489; 364/488
[58] Field of Search .................................. 364/488, 489, 364/490, 491, 578

[56] References Cited

U.S. PATENT DOCUMENTS

| | | | |
|---|---|---|---|
| 5,331,568 | 7/1994 | Pixley | 364/489 |
| 5,416,719 | 5/1995 | Pribetich | 364/489 |
| 5,491,640 | 2/1996 | Sharma et al. | 364/488 |
| 5,517,432 | 5/1996 | Chandra et al. | 364/578 |
| 5,519,627 | 5/1996 | Mahmood et al. | 364/488 |
| 5,537,580 | 7/1996 | Giomi et al. | 364/488 |
| 5,581,781 | 12/1996 | Gregory et al. | 395/800 |
| 5,594,656 | 1/1997 | Tamisier | 364/488 |

OTHER PUBLICATIONS

Automatic Verification of Finite–State Concurrent Systems Using Temporal Logic Specifications by E.M. Clarke et al, ACM Trans on Prog. Lang. and Sys., V. 8, No. 2, Apr. 1986, pp. 244–263.

"Symbolic Boolean Manipulation with Ordered Binary–Decision Diagrams" by R.E. Bryant, ACM Computing Surveys, V. 24, No. 3, Sep. 1992, pp. 293–318.

"Graph–Based Algorithms for Boolean Function Manipulation" by R.E. Bryant, IEEE Trans. on Computers, V. C–35, No. 8, Aug. 1986, pp. 677–691.

*Primary Examiner*—Vincent N. Trans
*Attorney, Agent, or Firm*—Irell & Manella LLP

[57] ABSTRACT

The method implements implicit sequential behavior using a general finite state machine architecture (FSM) through the systematic evaluation of control flow graphs (CFGs) having one or more weight statements which are sensitive to the same unique clock edge. Each of the weight statements contained in the CFG are assigned a state in the state machine. All of the executable paths between each weight statement are fully evaluated on a node-by-node basis. From this evaluation process, expressions are extracted which define combinational logic necessary to produce additional inputs to the FSM to produce the next state, as well as expressions representing outputs of the FSM as associated with each transition from one state to another. The method also deals with proper evaluation of unrollable loops.

1 Claim, 31 Drawing Sheets

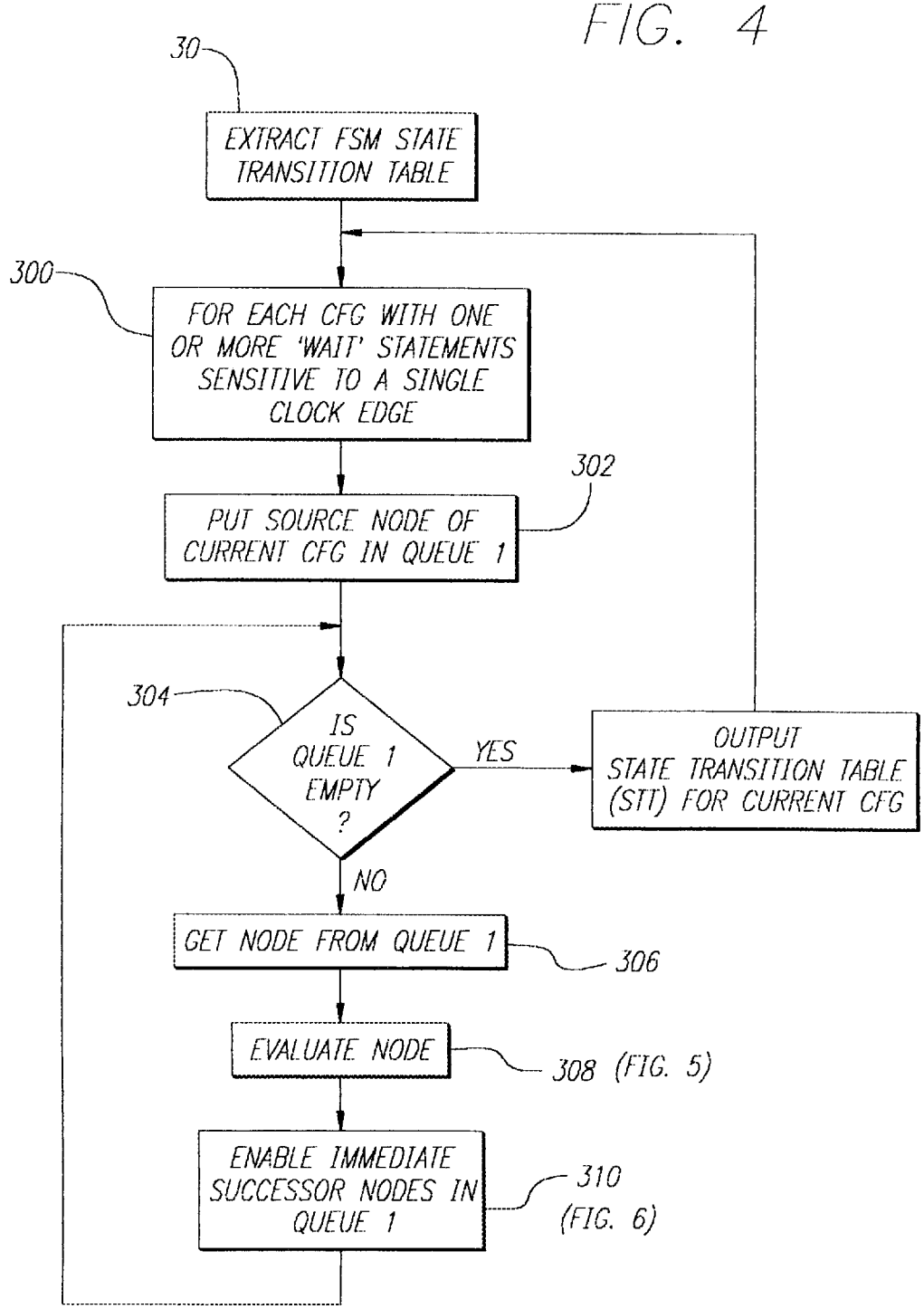

FIG. 20(a)

VHDL VERSION:

```
entry gcd is
    port( clk,rst   :in bit;
          in1,in2   :in integer range 0 to 15;
          ready     :out bit;
          result    :out integer range 0 to 15;
end gcd;

architecture behavior of gcd is
begin
    process
        variable x,y,t1:integer range 0 to 15;
    begin
        wait until (clk='1');
        ready <='a';
        x:=in1;y:=in2;
        if((x/=0) and (y/=0) then
            loop
                while (x>=y)loop
                    x:=x-y;
                    wait until (clk='1');
                end loop;
                t1:=x;x:=y;y:=t1;
                exit when (y=o);
            end loop;
        else
            x:=0;
        end if;
        resdy <='1';
        result <=x;
    end process;
end behavior;
```

FIG. 20(c)

EXTRACTED IMPLICIT STATE MACHINE:

STATE S1
 COND(1,9)  -->S2,
 COND(1,16)  -->S3,
 COND(1,1)  -->S1;

STATE S2
 COND(9,9)  -->S2,
 COND(9,16)  -->S3,
 COND(9,1)  -->S1;

STATE S3
 COND(16,9)  -->S2,
 COND(16,16)  -->S3,
 COND(16,1)  -->S1;

COND(i,j)=CONDITION FOR EXECUTING DIRECTED PATH FROM NODE i TO NODE j.

FIG. 20(e)

SIMPLIFIED IMPLICIT STATE MACHINE:

```
state S1
(in1/=0) and (in2/=0) and (in1>=2)   --> S2/S3,
    x <= in1-in2;           y <= in2;
    result <= result_q;     ready <= '0';
(in1/=0) and (in2/=0)                --> S2/S3,
    x <= in2;               y <= in1;
    result <= result_q      ready <= '0';
TRUE                                 --> S1
    x <= 0;                 y <= in2;
    result <= 0;            ready <= '1';

state S2/S3
(x_q>=y_q)                           --> S2/S3,
    x <= x_q-y_q;           y <= y_q;
    result <= result_q;     ready <= ready_q;
(x_q/=0)                             --> S3,
    x <= y_q;               y <= x_q;
    result <= result_q;     ready <= ready_q;
TRUE                                 --> S1,
    x <= y_q;               y <= x_q;
    result <= y_q;          ready <= '1';
```

FIG. 20(d)

EXTRACTED IMPLICIT STATE MACHINE state S1
(in1/=0) and (in2/=0) and (in1>=2)   ---> S2,
    x <= in1-in2;           y <= in2;
    result <= result_q;    ready <= '0';
(in1/=0) and (in2/=0) and (not (in1>=2))
and (in1/=0)
    x <= in2;             y <= in1;
    result <= result_q    ready <= '0';
((in1/=0) and (in2/=0) and (not (in1>=2))
and (in1/=0))
    x <= in2;             y <= in1;
    result <= in2;       ready <= '1';
(not((in1/=0) and (in2/=0)))    ---> S1
    x <= 0;               y <= in2;
    result <= 0;         ready <= '1';

state S2
(x_q>=y_q)                            ---> S2,
    x <= x_q-y_q;         y <= y_q;
    result <= result_q;    ready <= ready_q;
((not (x_q>=y_q) and (x_q/=0))   ---> S3,
    x <= y_q;               y <= x_q;
    result <= result_q;    ready <= ready_q;
((not (x_q>=y_q)) and (x_q/=0)) ---> S1,
    x <= y_q;               y <= x_q;
    result <= y_q;        ready <= '1';

state S3
(x_q>=y_q)                            ---> S2,
    x <= x_q-y_q;         y <= y_q;
    result <= result_q;    ready <= ready_q;
((not (x_q>=y_q)) and (x_q/=0)) ---> S3,
    x <= y_q;               y <= x_q;
    result <= result_q;    ready <= ready_q;
((not (x_q>=y_q)) and (x_q/=0)) ---> S1,
    x <= y_q;               y <= x_q;
    result <= y_q;        ready <= '1';

FIG. 21(a)

VERILOG VERSION:

```
module gcd (clk,rst,in1,in2,result,ready);
parameter size = 4;

input [size-1:0]in1,in2;
output [size-1:0]result;
output ready;

initial
begin
    ready=0;
    result=0;
end always
begin:sm
    reg[size-1:0]x,y,t1;

@(posedge clk);
    ready=0;
    x=in1; y=in2;
    if((x!=0) && (y!=0)) begin:break
        forever begin
            while (x>=y) begin
                x=x-y;
                @(posedge clk);
            end
            t1=x; x=y; y=t1;
            if (y==0) disable break;
            @(posedge clk);
        end
    end else begin
        x=0;
    end
    ready=1;
    result=x;
end
end module
```

METHOD OF EXTRACTING IMPLICIT SEQUENTIAL BEHAVIOR FROM HARDWARE DESCRIPTION LANGUAGES

BACKGROUND OF THE INVENTION

1. FIELD OF THE INVENTION

The present invention relates to the synthesis of circuit hardware from circuit behavior represented by hardware description languages (HDL), and more particularly to the extraction of hardware in the form of a finite state machine architecture from implicitly specified sequential behavior in the HDL description.

2. BACKGROUND OF THE RELATED ART

Electronic manufacturing technology presently allows the creation of monolithic integrated circuits that involve millions of transistors. Due to the sheer number of devices on a single chip, an entire industry has evolved specifically to supply the semiconductor industry with software and hardware tools to automate much of the integrated circuit design process. In particular, significant research and development effort has been directed toward effecting the extraction of circuit hardware, in the form of a hardware netlist, from descriptions of the circuit's behavior using hardware description languages (HDL).

Initially, techniques have been perfected to extract combinational logic circuits including AND gates, OR gates, NAND gates, NOR gates, complex combinations of the foregoing and flip-flops. At the next level, processes have been developed to extract finite state machine (FSM) circuit architectures explicitly described by HDL circuit descriptions.

Related application U.S. Ser. No. 08/376,491, discloses a method of extracting flip-flops from HDL descriptions, which is incorporated herein by this reference. Related application U.S. Ser. No. 08/362,028, discloses a method of extracting FSM architecture from HDL circuit descriptions which explicitly specify sequential circuit behavior, which is incorporated herein by this reference.

FIG. 1 illustrates a general FSM architecture. The general FSM architecture typically comprises an implicit state register (ISR) the output of which designates the current state of the state machine. Flip-flops 100 and 102 form the ISR of the general FSM architecture of FIG. 1. Of course, the number of flip-flops required for the ISR will depend on the number of states of the FSM. The combinational logic block 104 of the FSM architecture produces the "next state" inputs to the ISR flip-flops, which in turn determine the next state of the FSM. The transition to the next state occurs on the next rising edge of the single clock input 106. Combinational logic block 104 also produces outputs which can either be fed back as inputs into combinational logic block 104 simply provide output to other hardware blocks of the circuit or both. The outputs of the FSM are also latched on the rising edge of single clock input 106 and are defined to be of a certain value depending on the value of ISR. Finally, combinational logic block 104 receives as inputs both the previous state of ISR, shown as q0 108 and q1 110, as well as inputs 112, which can emanate from other signals internal or external to the circuit, and are defined by the HDL. The FSM architecture may also include a single reset input 118, which resets the FSM to a known initial state.

FIG. 2 represents an example of a state machine which could be implemented using the general FSM architecture of FIG. 1. The example state machine of FIG. 2 has four states 120, each of which is represented by a value assumed by the ISR. Transition arcs 122 illustrate the possible transitions between states 120 which can legally occur for the example state machine of FIG. 2. Variables 124 represent inputs and outputs of the example FSM which either must assume certain values in order that a particular transition can occur between one state and another (FSM inputs), or must assume a particular value as a result of the transition (FSM outputs). Those of ordinary skill in the art will recognize that there are other more general FSM architectures than the FSM architecture illustrated in FIG. 1. As illustrated by the example state diagram of FIG. 2, in order that the FSM transitions from one state to another, certain conditions must be met. Thus, for the FSM to transition from state 1 ($S_1$) to state 2 ($S_2$), the FSM must currently be in $S_1$ (i.e. the previous state). Also, the variables X, Y, and RESULT may have to assume a particular value before the transition is enabled (i.e. act as inputs). Finally, X and/or Y and/or RESULT may have to assume a particular value subsequent to the transition (i.e. act as FSM outputs).

The state transitions represented by arcs 122 between states 120 can be summarized in the form of a state transition table which defines the legal transitions between the states as well as the conditions (i.e., the necessary values of the variables) requisite to the transition between each state.

As previously discussed, methods have been disclosed by which an FSM architecture can be extracted from the HDL description of a circuit when such state transition conditions are explicitly specified in the HDL description. Although some work has been done in the past in attempting to extract FMS descriptions from languages which are specific to expressing state machine (i.e. sequential) behavior, no one has heretofore provided a method for extracting such behavior from general functional HDLs when such behavior is only implicitly specified.

Because it is desirable to have an integrated tool which can synthesize the hardware implementations of most if not all circuit behavior and with the least amount of restrictions on the modes of expressing that behavior, it is highly desirable to provide a method of inferring hardware implementations of implicitly specified sequential behavior.

SUMMARY OF THE INVENTION

The present invention is a method of synthesizing structural netlist in the form of a finite state machine (FSM) from those processes of an HDL circuit description which specify implicit sequential behavior. The method of the invention operates on control flow graphs (CFGs) which represent the control flow of the processes which comprise the HDL functional description of the circuit. CFGs are generated by known HDL parser routines which perform lexical and syntactic analysis of each HDL process to generate a CFG for each such process.

The method of the invention only operates on those CFGs which specify implicit sequential behavior using wait statements or event control statements which are sensitive to a single unique clock edge. Each CFG also represents embedded data-flow information. The data flow is represented by a directed acyclic graph (DAG).

For each CFG having the above-described characteristics, the present invention systematically evaluates the CFG beginning at its source node to build a state transition table (STT) which will define the FSM circuit which implements the behavior described by the HDL process that is represented by the CFG currently being evaluated. The STT describes the implementation details as well as the state diagram of the FSM defines the set of states, the set of transitions which can occur between the states, and a set of labels which are associated with each transition. Each label of the set of labels provides information which defines the values of inputs of the FSM that condition the particular transition as well as the values of outputs of the FSM which must be assumed as a result of a transition. The state transitions, as well as the output expressions are defined by the DAGs representing data-flow dependency.

For the current CFG, the method of the invention extracts the STT by evaluating all executable paths between wait nodes (or event nodes). The CFG is traversed by a breadth-first search algorithm that evaluates each control node of the CFG once all of its activated parent nodes have been evaluated. Each time a wait node is encountered during this process, implicit previous states (IPS) are determined for the wait node under evaluation through a simple depth-first search (DFS) in the opposite direction of the control flow back to any previously evaluated wait states. Further, an extended level maximal set (ELMS) is calculated based on a breadth-first search (BFS) in the opposite direction of the control flow back to each of the implicit previous states. The ELMS is used in conjunction with other known optimization techniques (e.g. common sub-expression elimination, dead-code elimination and life-variable analysis) to minimize the expressions of the variables defining the FSM inputs and outputs.

Thus, each wait node (and sometimes the source code) of the current CFG corresponds to a state of the state machine, and the conditions for transitions from one state to another correspond to the evaluation of all executable paths between the wait nodes which correspond to those states.

Each node of the CFG is evaluated by first computing its node activation, then computing the signal values of all input and output variables v at the current node n, computing the edge activation for each of the successor nodes of n and then evaluating each of the computed edge activations by substituting in signal values for variables v for the current node n into the expression for the computed edge activations.

The evaluation of each node is further dependent upon the type of node that it is. Loop nodes must be either unrolled if the loop is specified using a loop index which defines a finite number of iterations, or expanded if there is no loop index or the loop index is variable and thus does not specify a finite number of iterations. A loop which can be unrolled is unrolled according to known techniques of loop unrolling. If the loop cannot be unrolled, the loop is expanded by replacing the loop node with an if node the conditions for which are the same as for the specified loop condition. The true edge of the if node is connected to a duplicated version of the original loop body, the output edge of which is connected to a second if statement, which replaces the original iterate node of the loop. The second if node is also predicated upon the original loop condition, the true edge of which is connected to a second duplicated version of the original loop body. The edges of both the first and second if nodes representing a false condition, are both input to a first join node. The output of a first join node and the second duplicated version of the original loop body are then connected to a second join node. The expanded loop is then replaced in the original CFG such that the first if node takes the place of the original loop node and the second join node takes the place of the original terminate node. The evaluation process then continues at first if node which replaces the original loop node.

If the current node n is an iterate node, it must be determined whether the loop node associated with the iteration node under evaluation dominates all of the nodes comprising the set of nodes which define implicit previous states. If the answer to this inquiry is no, the behavior cannot be synthesized as a finite state machine and an error message is generated. The method then goes back and attempts to process the next CFG incorporating wait statements sensitive to a unique clock edge.

If the current node n is a simple node, and is also an assignment node, the expression assigned to a particular variable v is evaluated and that value defined by the expression is substituted for the current value of the variable at the particular node n. If the simple node is a source node, a state is added to the STT for the source node (the ISR is assigned a value vals for that node).

If the node is a wait node, a state is added to the STT for that node by assigning a value $val_w$ to the ISR for that node. The set of all IPS values is then computed for the wait node which defines all of the other wait nodes or source node from which execution of the CFG can reach the current wait node $n_w$. A function $f_w$ is calculated for $n_w$ (i.e., $F_n$) which is essentially the node activation for the current wait node $n_w$. The function $F_n$ is evaluated for each node represented in the IPS set by substituting for the variable ISR in the function the value assigned to ISR for each of the nodes in the IPS set. The evaluated function $F_n$ for each node in the IPS set defines the conditions requisite for the transition from the state associated with each of the nodes of the IPS set to the current wait node $n_w$ and each of these transitions along with their requisite conditions is added to the STT. A second function $H_w$ for $n_w$ (i.e. $H_n$) is computed for all variables v which generates the minimal expression for each variable v at $n_w$. The function H, is evaluated for all variables v by substituting for the variable ISR the value assigned to ISR for each of the nodes which are members of the IPS set (i.e. all of the parent weight nodes of current-node $n_w$. The results of this evaluation become the expression of the outputs for each of the transitions from a previous state defined for each node in the IPS set to the current node $n_w$ as a result of that transition.

Thus, the STT which describes the state transitions between each state and another state of the FSM along with the values of inputs which provide a condition for the transition as well as the expressions which define the outputs as a result of those transitions are built systematically as the CFG is evaluated in accordance with the method of the invention.

It should also be noted that the appropriate values of v must be computed and propagated to the current node under evaluation even when it is not a wait node.

BRIEF DESCRIPTION OF THE DRAWINGS

FIG. 6 is a detailed procedural flow diagram of the signal values computation step of FIG. 5.

FIG. 18 is a detailed procedural flow diagram of the $F_n$ computation step of FIG. 13.

FIG. 20(a) is a program listing exhibiting the requisite characteristics for permitting extraction of its implicit sequential behavior.

FIG. 20(c) is a skeleton state transition table for the process of FIG. 20(a).

FIG. 20(d) is the extracted implicit state machine for the process of FIG. 20(a).

FIG. 20(e) is a simplified state transition table for the process of FIG. 20(a).

FIG. 21(a) is the process of FIG. 20(a) written in Verilog.

DETAILED DESCRIPTION OF THE INVENTION

The method of the present invention extracts a hardware implementation of sequential behavior implicitly specified by a functional description of a circuit using a hardware description language (HDL). The hardware implementation is inferred as a finite state machine (FSM) the general architecture of which is described in FIG. 1. For each functional process of the HDL circuit description which implicitly specifies sequential behavior capable of being represented by the FSM architecture of FIG. 1, the method of the present invention infers the details required to implement the process in accordance with the architecture of FIG. 1. Thus, the method of the invention infers the number of unique states of the FSM, as well as the combinational logic circuitry which is capable of producing inputs to the implicit state register (ISR) to produce the next state. This combinational logic generates the next state based on input variables which include values identifying the previous state. Further, the combinational logic circuitry must also produce outputs of the FSM which have values specified by the process.

The method of the present invention accomplishes this result by systematically building a state transition table (STT) which defines all of the states of the FSM, all of the legal transitions between states, the requisite values of any of the inputs which define conditions under which each of the transitions can occur, and the values of the outputs of the FSM which must be produced as a result of each of those transitions. This is accomplished by a systematic evaluation of a control flow graph (CFG) which defines the control flow of the functional process which is capable of implementation in accordance with the architecture of FIG. 1. The method of the present invention is restricted to extracting sequential behavior to that which can be implemented using the FSM architecture of FIG. 1. Thus, this restriction prohibits the extraction of implicit sequential behavior that is not sensitive to a unique clock edge. Further, the outputs of the FSM are registered because they are defined within a process which is sensitive to only one clock edge.

Figure 3:
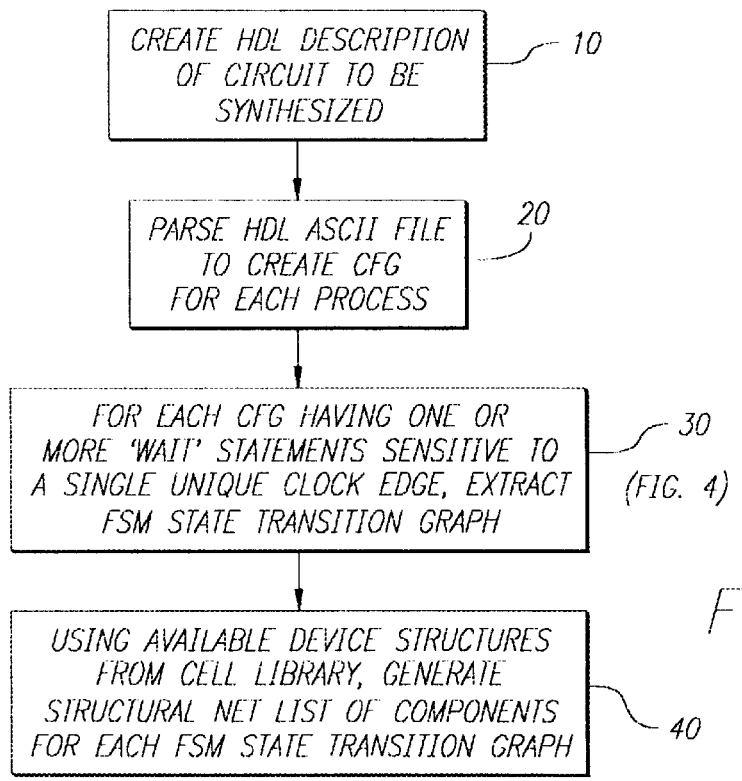
FIG. 3 is a high level procedural flow diagram of a method of extracting implicit sequential behavior from hardware description languages.

Implicit sequential behavior is typically specified in an HDL description using statements that allow the process to suspend its execution until an event occurs. In one commercially available HDL language, VHDL, this statement is known as a wait statement. In a second commercially available HDL language, Verilog, an event control statement is used. While this description is written from a VHDL standpoint, those of skill in the art will recognize that the method of the present invention is equally applicable to other statements used in other languages such as the event control statement of Verilog. FIG. 3 illustrates a high-level procedural flow diagram for the method of the present invention. Those of skill in the art will recognize that the present invention can be used in conjunction with other known methods of extracting hardware from HDL circuit descriptions in order to fully synthesize a circuit described by the HDL description. Block 20 of FIG. 3 illustrates the process of parsing the HDL description to create CFGs for each process of the HDL description. HDL parsers are well known in the art and are used to perform lexical and syntactic analysis of the HDL processes and to generate control flow graph representations of each of the processes. It is further noted that each CFG contains embedded data-flow information.

Block 30 of FIG. 3 represents the procedure which embodies the method of the present invention. The method of the present invention identifies all of the CFGs having one or more wait statements sensitive to a single unique clock edge. For each of the identified CFGs, the invention extracts an FSM state transition table (STT). Those of skill in the art will recognize that known techniques for extracting explicit sequential behavior as well as combinational logic from the remaining CFGs can be applied in conjunction with the method of the present invention to extract hardware representations of all of the processes comprising the HDL description of the circuit to be synthesized.

Block 40 represents the known step of taking extracted hardware representations generated through the analysis of the CFGs and creating a structural netlist from the available device structures stored in a cell library. Thus, block 40 will take the STT information from block 30, as well as STTs extracted from explicit sequential behavior and output representing extracted combinational behavior to produce a structural netlist of the entire circuit to be synthesized.

Figure 22:
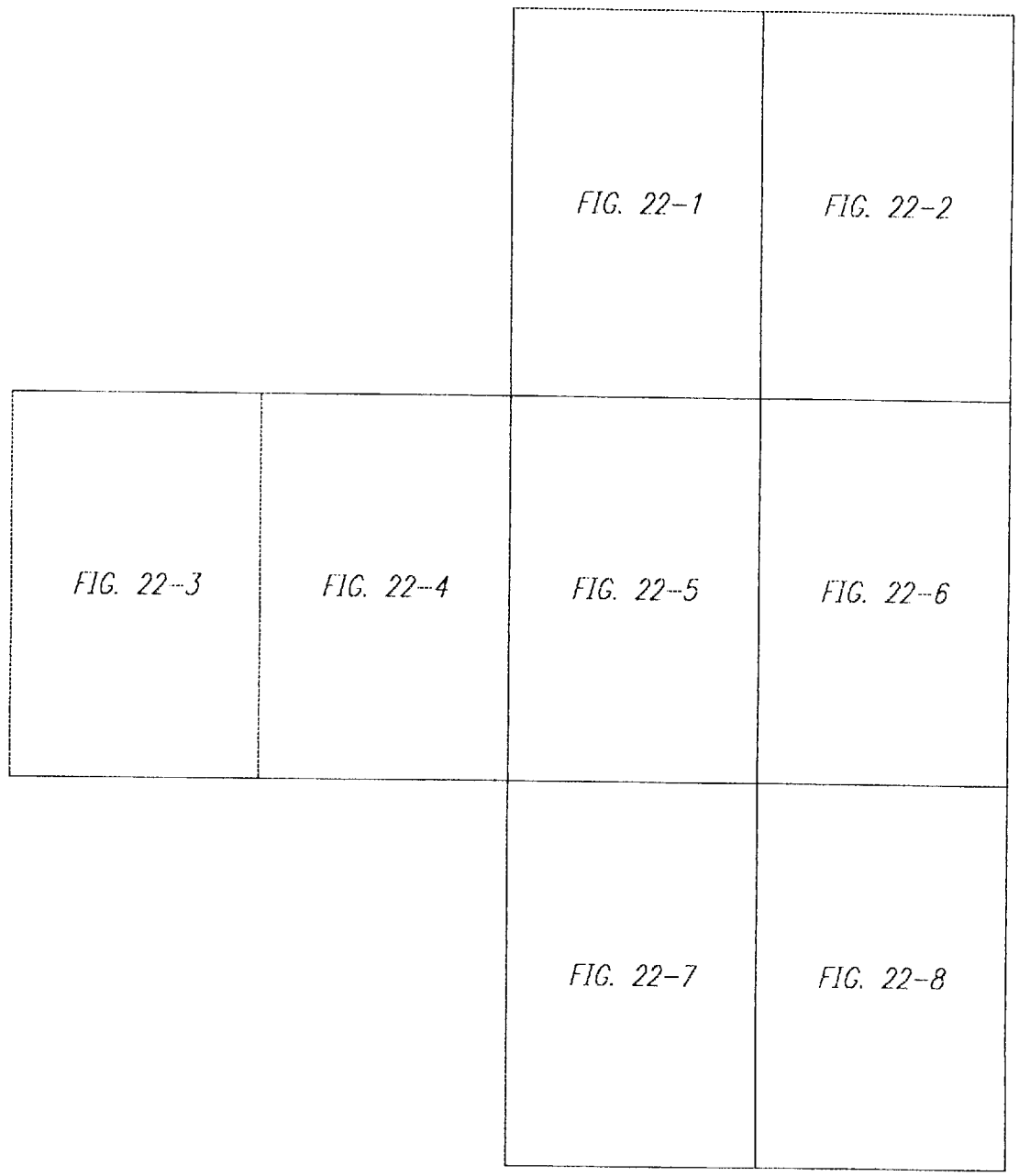
FIG. 22 is a hardware logic diagram of the finite state machine generated from the simplified state transition table of FIG. 20(e).
Figures 1, 22:
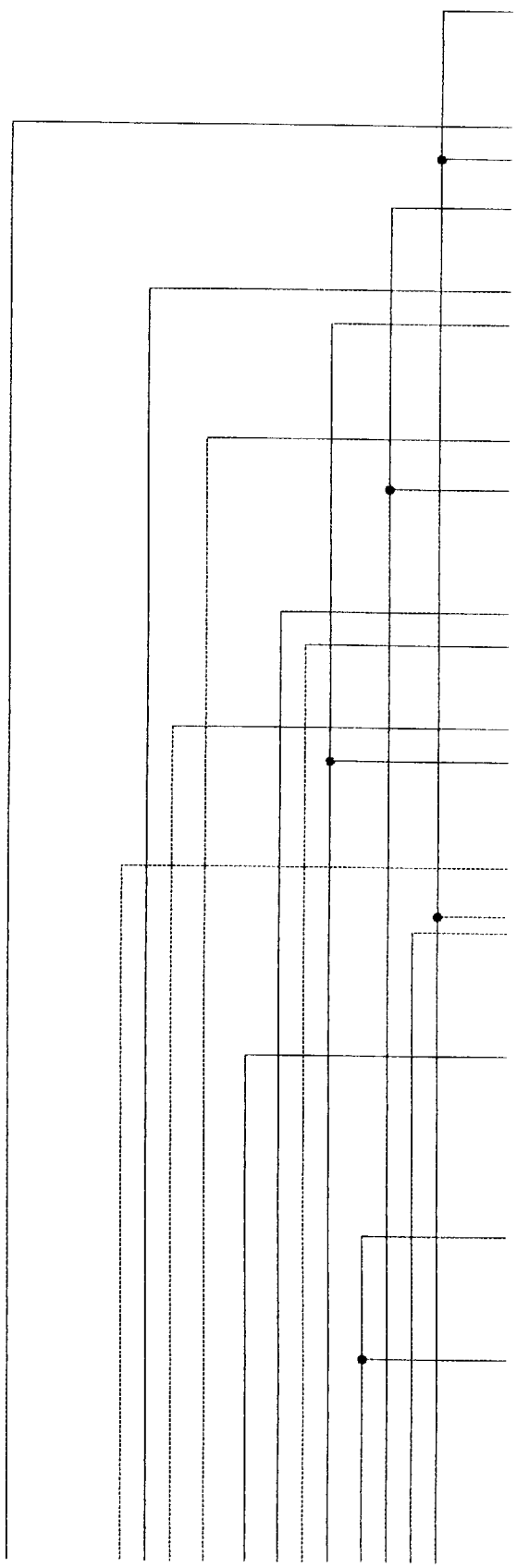
Figures 2, 22:
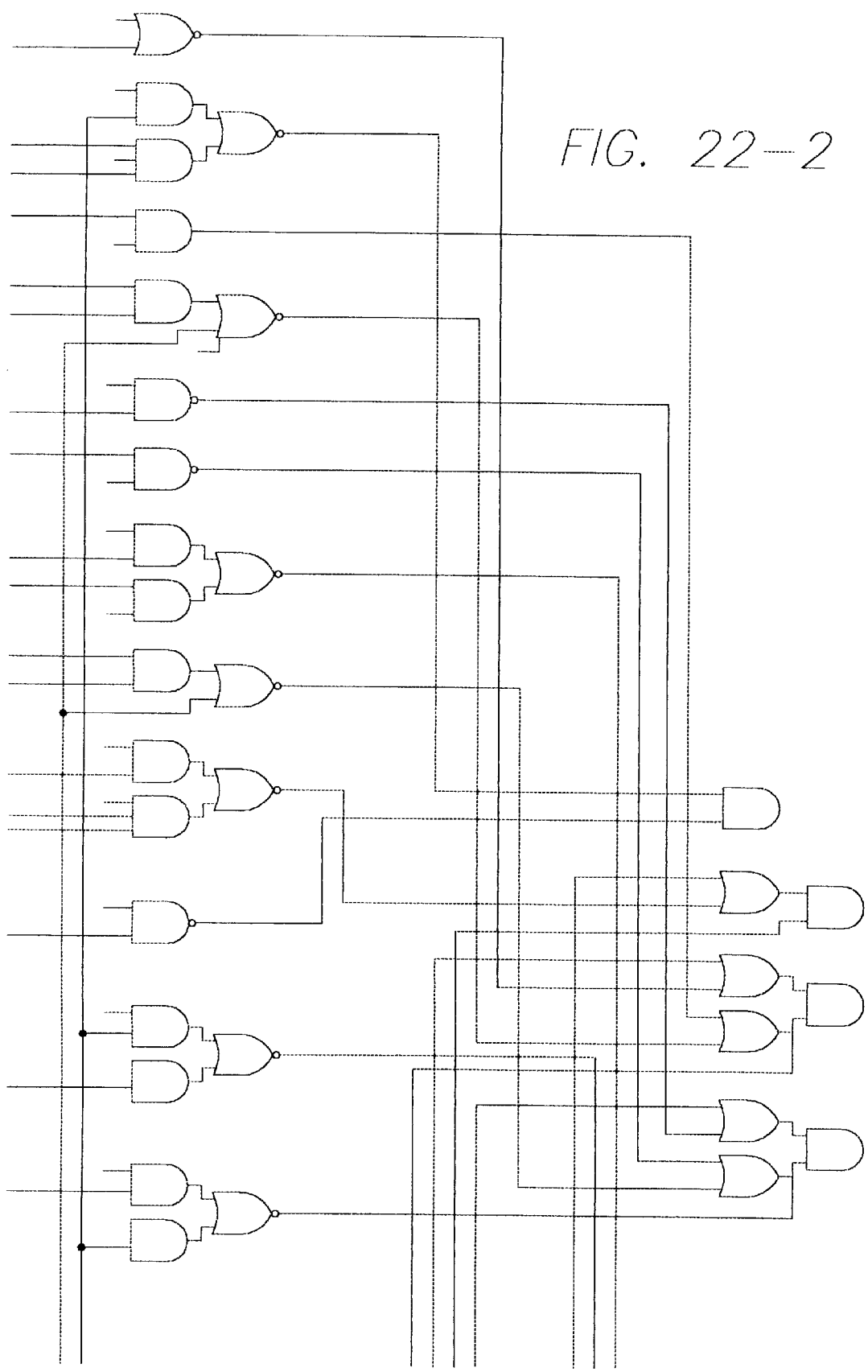
Figures 3, 22:
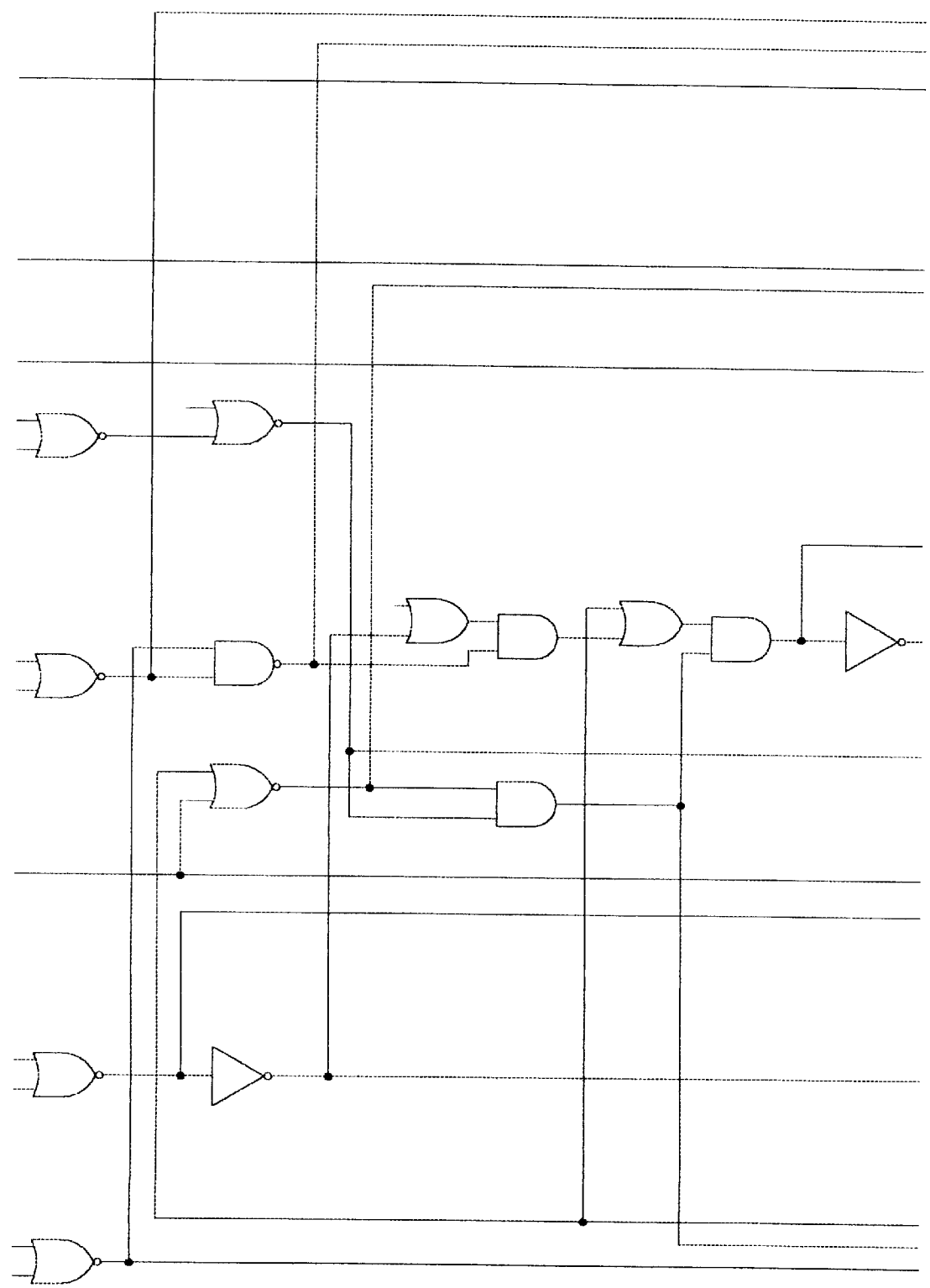
Figures 4, 22:
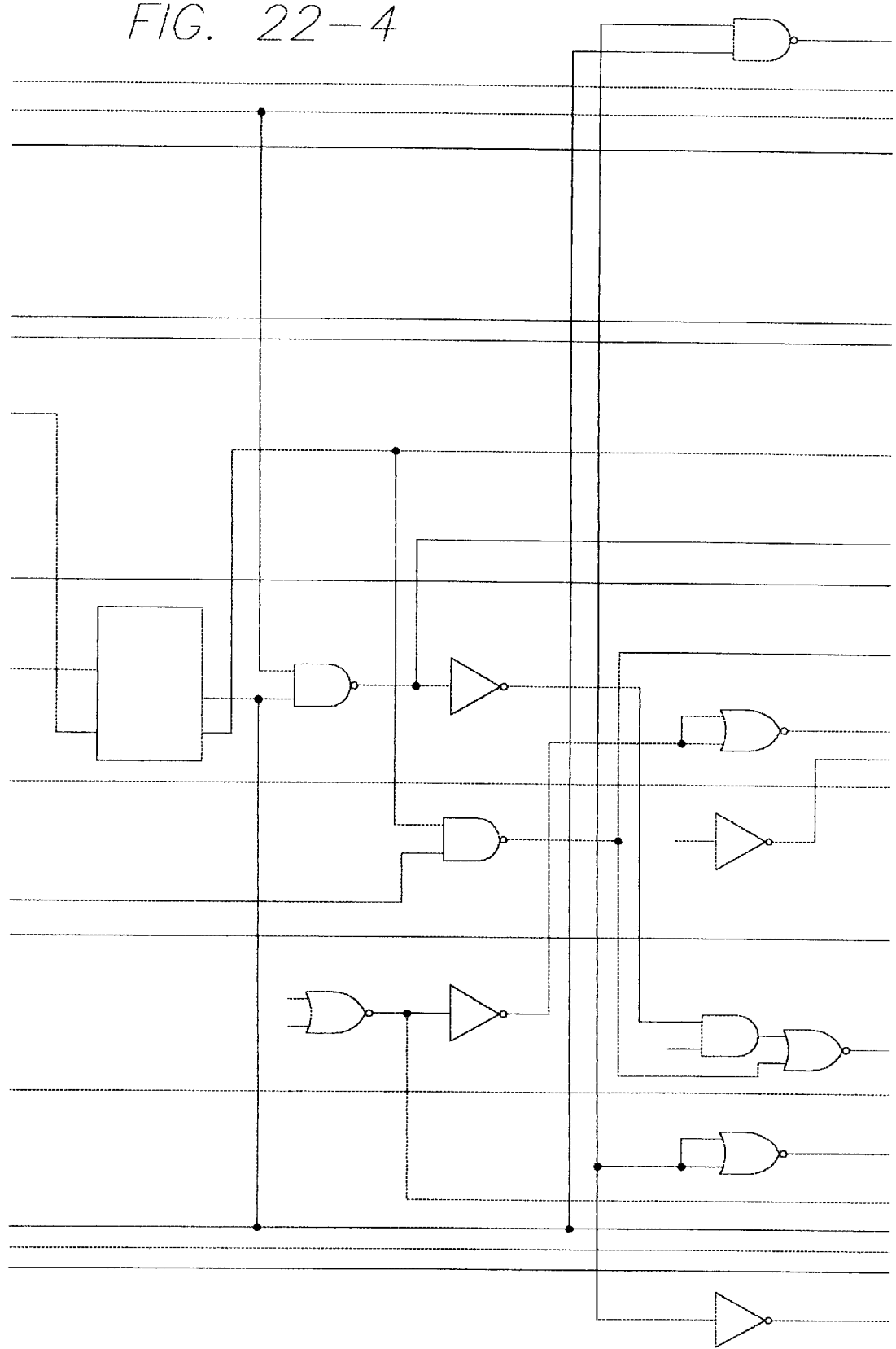
FIG. 4 is a procedural flow diagram of the process for sequentially evaluating control nodes.
Figures 5, 22:
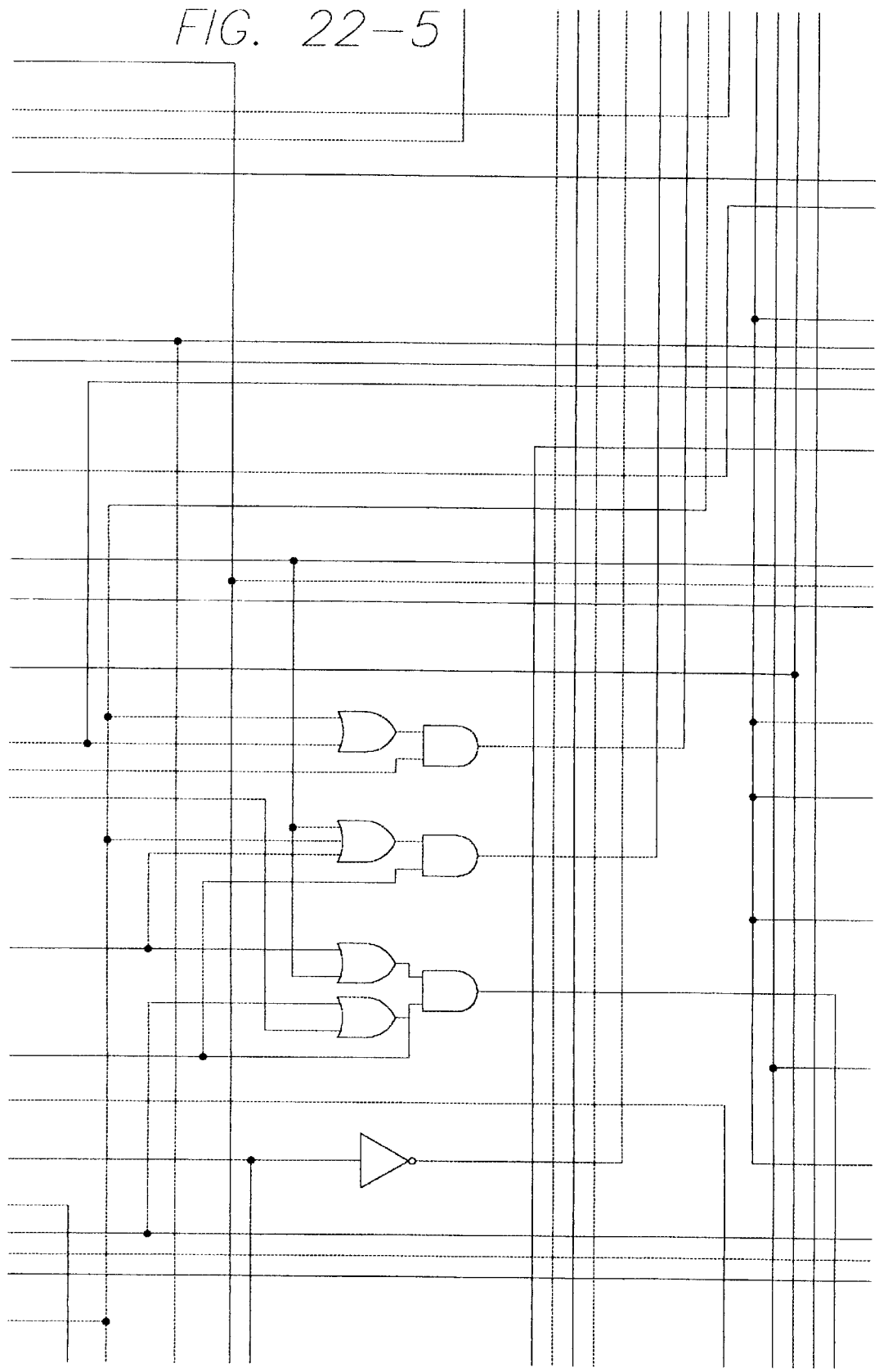
Figures 6, 22:
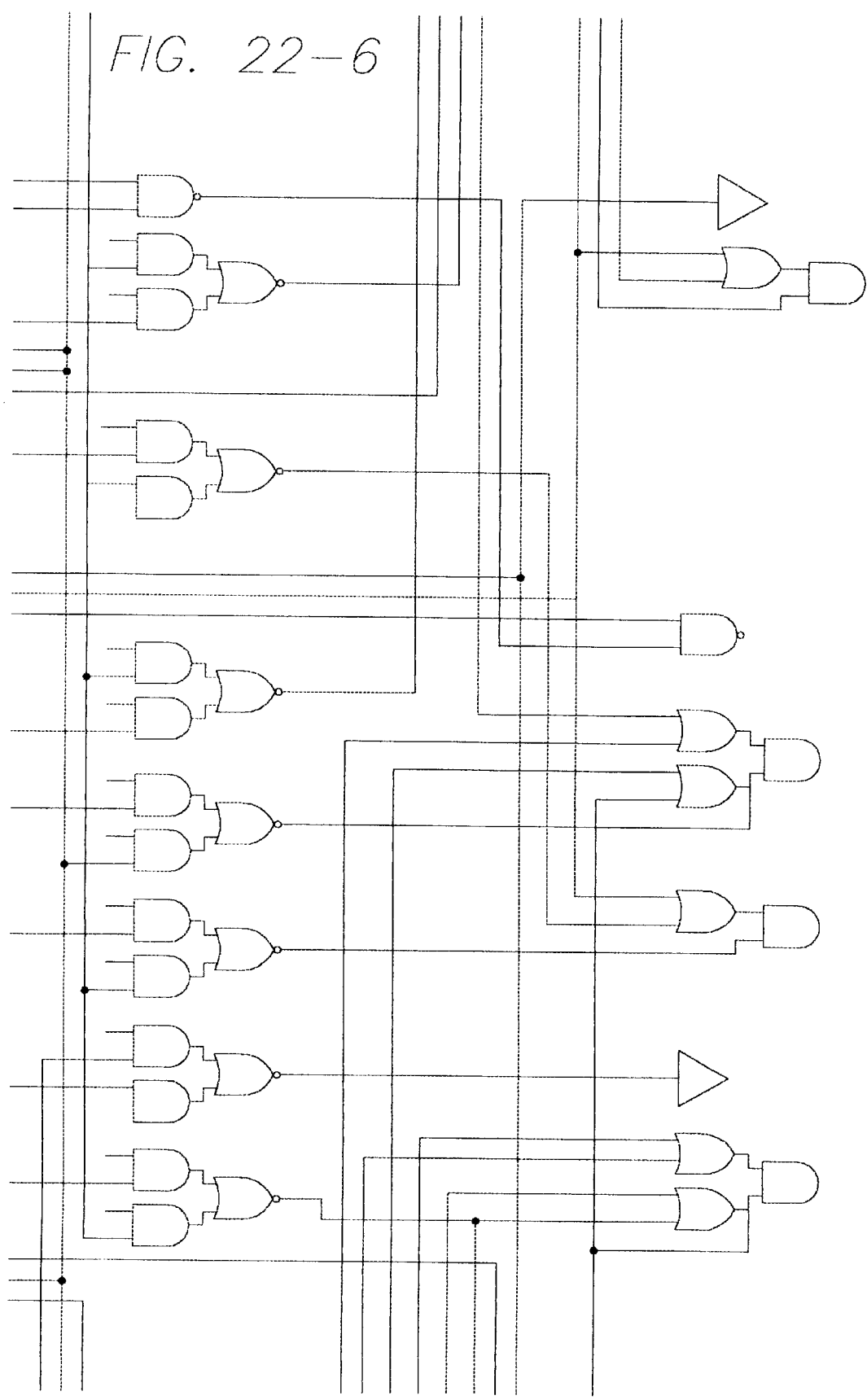
Figures 7, 22:
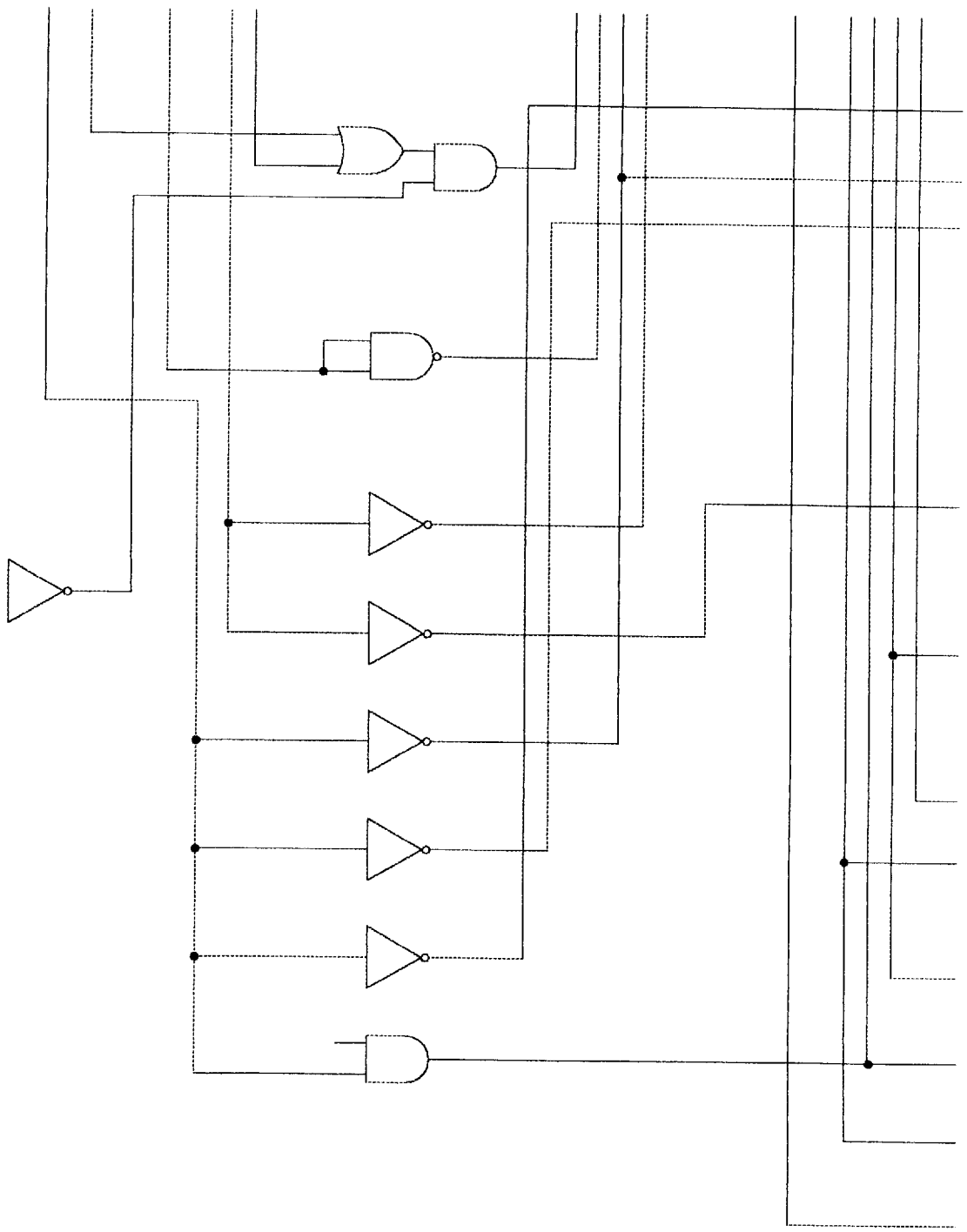
Figures 8, 22:
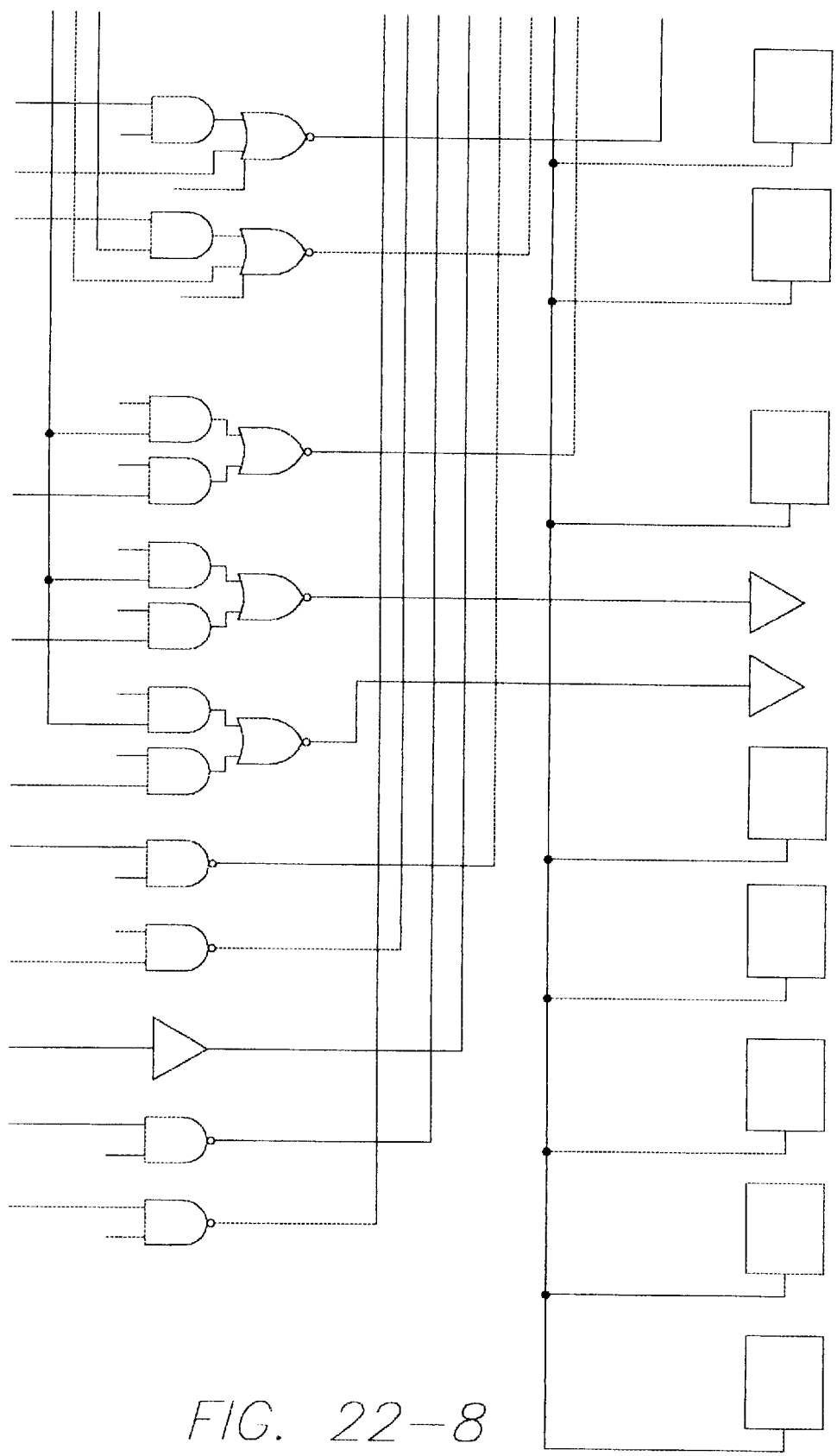

FIG. 4 illustrates a procedural flow diagram defining the process by which control nodes comprising the current CFG are sequentially evaluated for purposes of extracting the FSM STT from the implicitly specified sequential behavior of the process represented by the current CFG. Block 300 represents the step of identifying from the set of all CFGs generated by the parsing step of block 20 (FIG. 3) specifying implicit sequential behavior implementable as an FSM. After a node is placed into Queue 1, the node is evaluated in accordance with procedure 308 of FIG. 5. Block 310 represents a procedure for determining which of the unvisited nodes of the current CFG will be evaluated next. Three procedures implement a simple Depth First Search (DFS). The general purpose of procedural flow described in FIG. 4 is to systematically evaluate all of the executable paths between the wait nodes of the current CFG. Each node is systematically evaluated as a function of its node activation as well as the minimal data expressions representing the value of each of the variables of the process at the current node n (i.e. the node currently being evaluated).

The node activation is an expression for a given node that evaluates to true when the node n is active. The edge activation is an expression $C_{n,j}$ that is associated with each edge of the CFG between node n and any of its successor nodes j. The edge activation is true when control is passed from node n to its successor j. Thus, node activation for a given node n is defined recursively to be as follows: For all wait or source nodes, $c_n=1$ (i.e., is true). For all other nodes n, $c_n = \Sigma c_j \cdot C_{j,n}$ where j is the set of all parent nodes of n (i.e. $PN_{(n)}$).

Edge activation $C_{i,n}$ is true for all edges from any node which is not a fork node, a wait node, or a source node. For edges from fork nodes the expression representing the predicate or case selector determines that exactly one of the edge activation expressions is true and all others are false. For a source node or any wait node, the expression representing the edge activation is set to $ISR=val_n$. ISR is a variable representing the output of the implicit state register, and $val_n$ represents the value of the implicit state register output for node n. A directed path from any node n to node j of a control flow graph is said to be activated if no edge activation of that path is evaluated to be false.

The data expression for any live variable v, specified by the process, and any control node n is denoted $de_n(v)$ is defined recursively as follows:

$$de_{sc}(v) = IV(v) \tag{1}$$

$$de_w(v) = v\_q \tag{2}$$

$$de_a(v) = e_a(\text{local expression}) \tag{3}$$

$$de_n(v) = \Sigma c_j \cdot de_j(v) \tag{4}$$

where j=the set of all parent nodes of n.

Figure 5:
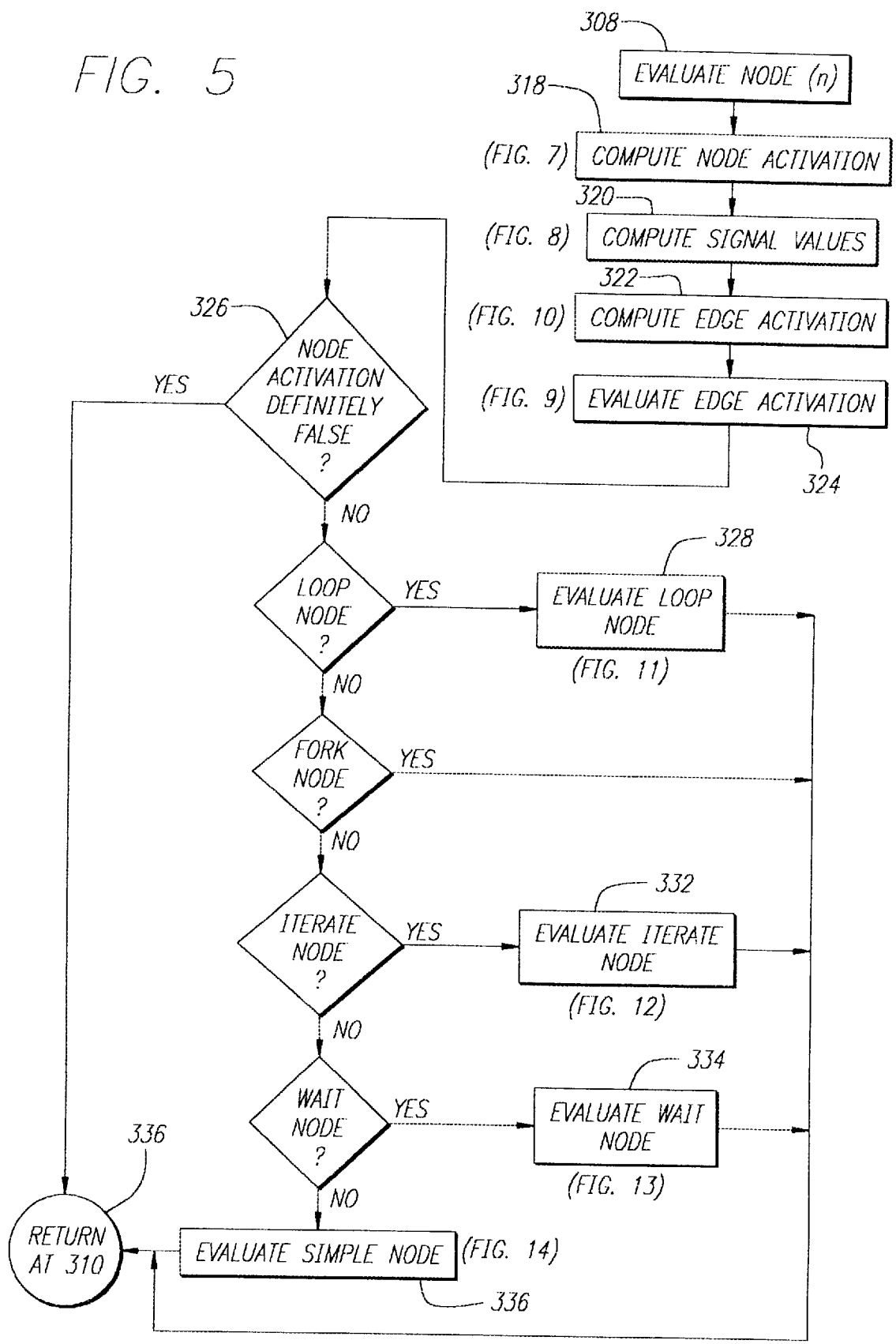
FIG. 5 is a procedural flow diagram of the node evaluating step of FIG. 4.
Figure 7:
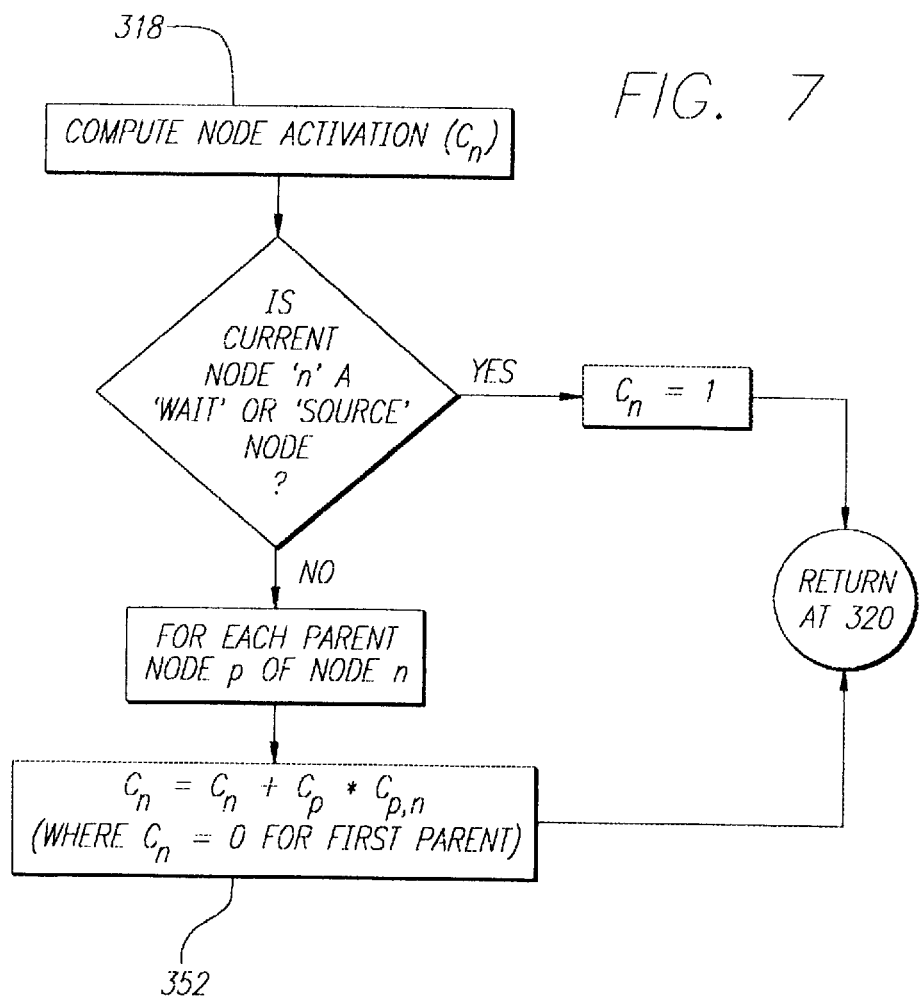
FIG. 7 is a detailed procedural flow diagram of the node activation computation step of FIG. 5.

Equation (1) shows that the data expression of variable v at a source node is set at its initial value (IV). Equation (2) shows that the data expression of variable v for a wait node is reset to an implicit variable v_q, which corresponds to the previous value of v set in previous states. Equation (3) shows the data expression of variable v at an assignment node that sets that variable. Equation (4) shows that the data expression of variable v at a node that does not set that variable and is neither a source node nor a wait node is the Boolean sum of the values determined at each of the parent nodes of node n, banded with that parent node's activation. Data expression of dead temporary variables at a node n are set to unknown values. The evaluate node procedure 308 is illustrated in FIG. 5 and operates in accordance with the foregoing definitions. Block 318 represents a procedure for computing the node activation in accordance with the foregoing equations. FIG. 7 illustrates a more detailed procedural flow for the procedure of block 318.

Figure 8:
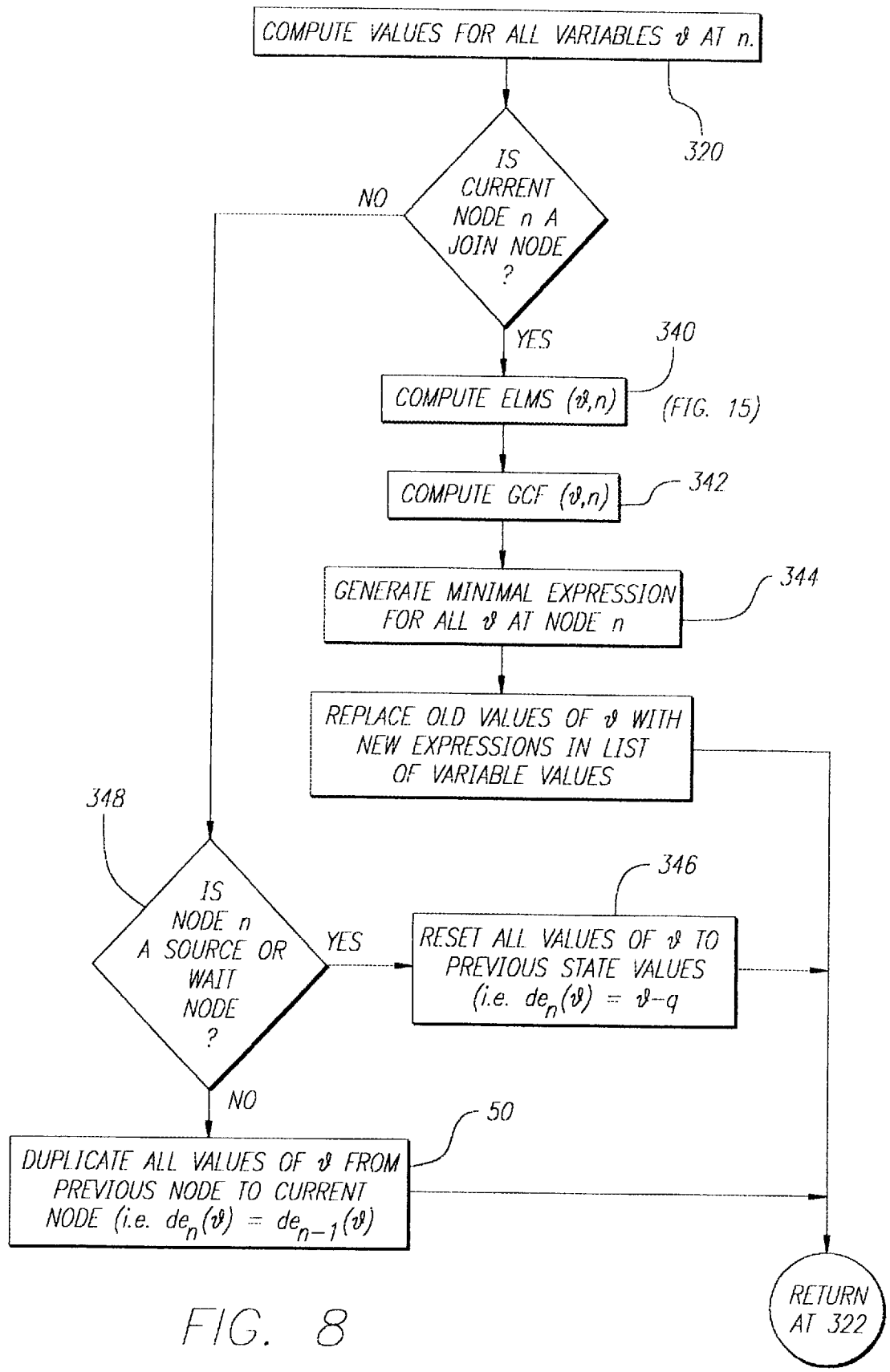

Block 320 of evaluate node n procedure 308 computes the signal values for the live variables at node n in accordance with the above equations. A more detailed procedural flow implementing the compute signal values routine 320 is illustrated in FIG. 8. As can be seen from the flow of FIG. 8, if the current node n is a source or wait node, decision block 348 transfers control to block 346 where all values of variables v are set to initial values in the case of a source node, or values at previous states in the case of a wait node, in accordance with equations (1) and (2) above. If the current node n is neither a join node, a source node or a wait node, control is transferred to block 350 at which all values of v are propagated to the current node n from the previous node just evaluated. If the current node n is a join node, control proceeds to block 340 which computes an extended level maximal set (ELMS) which is determined for each variable v from the current node n. ELMS(v,n) is the set of ancestor nodes that are individually furthest in the direction opposite to the flow from node n in the CFG which has the following properties: First, if a given node s is a member of the ELMS set, the directed path from node s to node n is activated. Second, there can be no activated path from node s to node n through any node m which is a wait node or at which there is an assignment to variable v. Third, all activated paths from any node in IPS(n) to n must pass through a member of the ELMS set. IPS(n) is the set of implicit previous states of node n, which is the set of ancestor wait nodes of n that are individually closest in the direction opposite to the flow from node n in the control flow graph. Members of IPS(n) are either a wait node or a source node and there must be at least one activated path from a member of IPS(n) to n that does not pass through a wait node.

Figure 15:
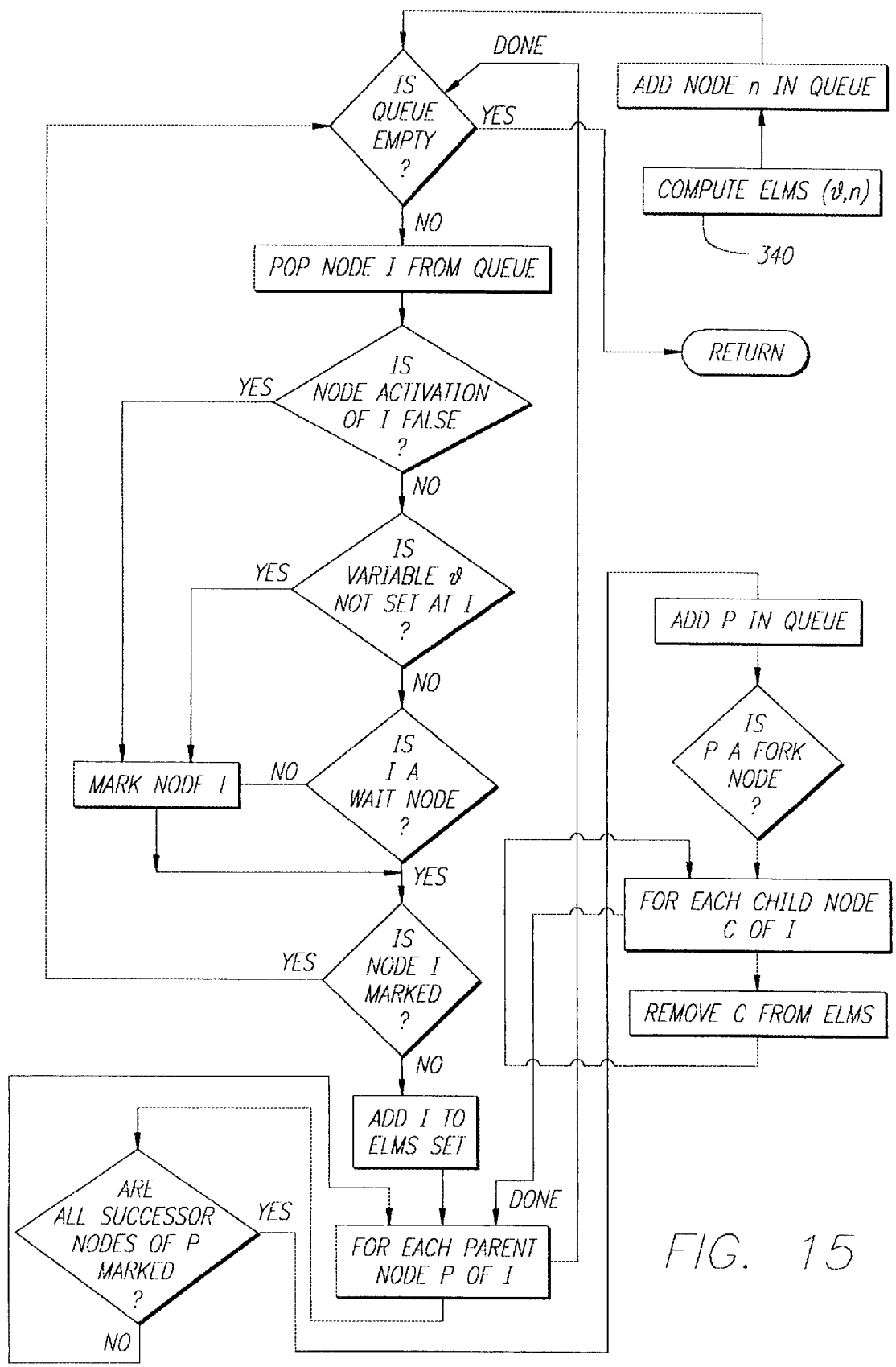
FIG. 15 is a detailed procedural flow diagram of the extended level maximal set computation step of FIG. 8.

The procedural flow diagram of FIG. 15 shows a more detailed procedural flow for the compute ELMS(v,n) procedure of block 340. Once the ELMS(v,n) has been calculated, control is transferred to block 342 which computes the greatest common factor (GCF(v,n)) in accordance with known techniques. A minimal expression for all variables v at node n can then be generated in accordance with the equation as follows: $de_n(v) = \Sigma c_j \cdot de_j(v)$, where j is each of the nodes of the ELMS(v,n) set. This equation follows because there are no nodes changing any of the variables v from any of the nodes in the ELMS set to node n. It is then possible to factor the activation condition of the node that dominates node n and any node in the ELMS set with respect to the IPS(n) set. This dominator vertex is called the greatest common factor (GCF), which is calculated at block 342 using known techniques.

It should be noted that, while the generation of a minimal expression for v at node n using a level maximal set (LMS) as well as the use of a GCF to further reduce the expression of variables v have been known in the past, the notion of an LMS has been extended to operate in the context of sequential behavior in accordance with the present invention. For background information concerning previously applied optimal variable expressions in a context of combinational logic, reference can be made to the following reference: G. Colon-Bonet et al., "On Optimal Extraction of Combination Logic and Don't Care Sets from Hardware Description Languages," in ICCAD, PP. 308–311, November 1987, which is incorporated herein by this reference.

Figure 10:
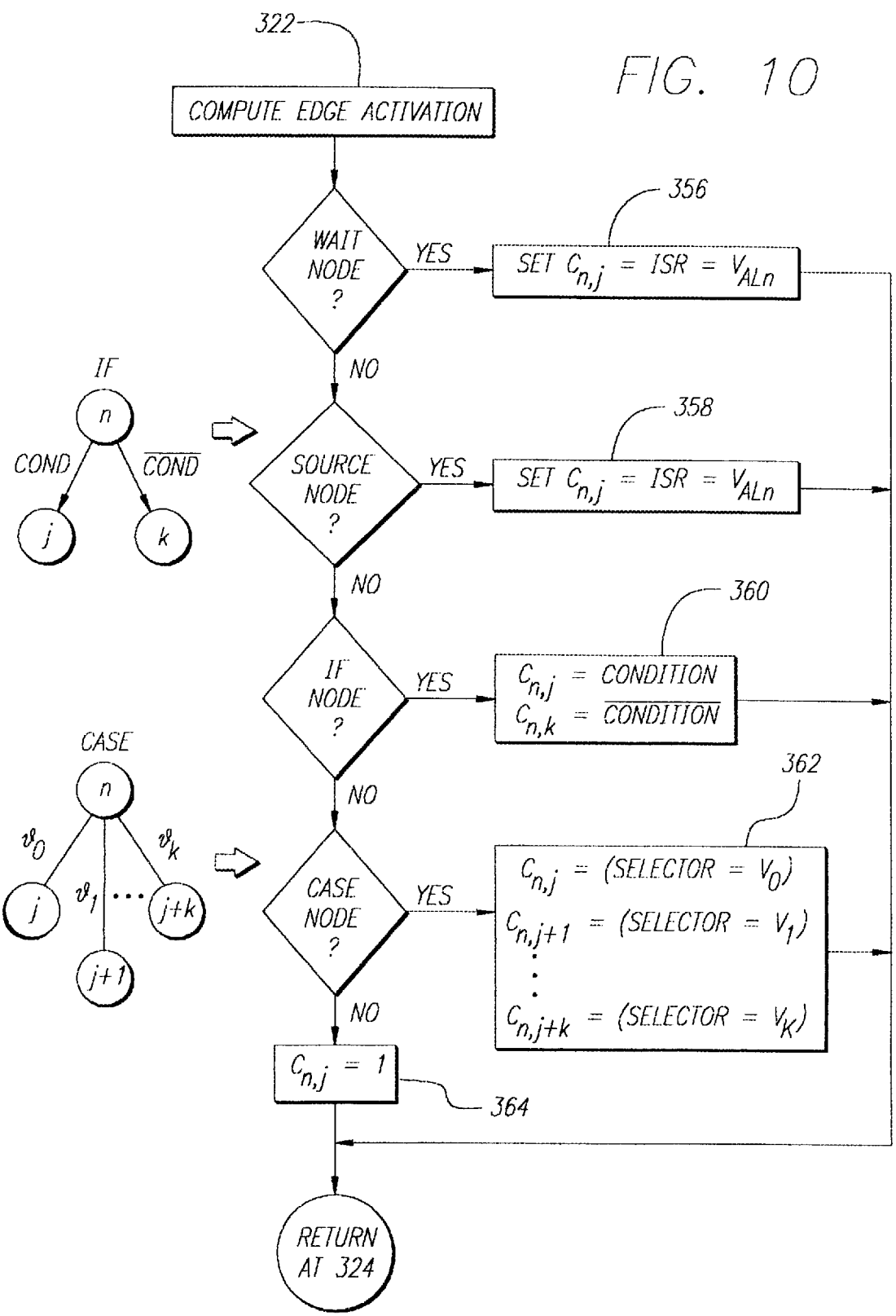
FIG. 10 is a detailed procedural flow diagram of the edge activation computation step of FIG. 5.

The evaluate node procedure 308 of FIG. 5 then proceeds to block 322 at which time edge activations are computed for the edges connecting node n to its successor nodes. A more detailed procedural flow is illustrated in FIG. 10 for the compute edge activation procedure 322. It can be seen from FIG. 10 that the compute edge activation procedure 322 implements the above-described definitions of edge activation.

Figure 9:
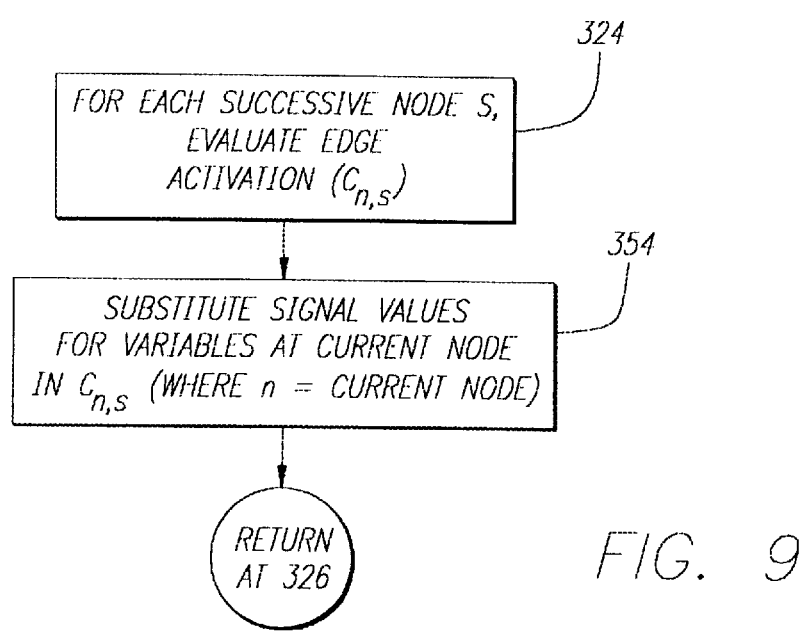
FIG. 9 is a detailed procedural flow diagram of the edge activation evaluation step of FIG. 5.

Once edge activation has been computed, in accordance with procedure 322, the evaluate node procedure 308 proceeds to evaluate the edge activations computed by the compute edge activation procedure 322 in light of the current values of the variables as computed by the compute signal values from procedure 320 of FIG. 8. A more detailed procedural flow is illustrated in FIG. 9 for the evaluate edge activation procedure 324.

Upon completion of procedure 324, the evaluate node procedure 308 of FIG. 5 determines at block 326 whether the node activation evaluates to a definitely false condition. If the node activation of current node n evaluates to a definitely false condition, that branch of the CFG will never be executed and therefore need not be implemented in the hardware. If the node activation of current node n is either true or could be evaluated to be true, procedure 308 continues processing at block 328 if the current node n is a loop node, at block 332 if current node n is an iterate node, at block 334 if the current node n is a wait node, or at block 336 if current node n is a simple node.

Figure 6:
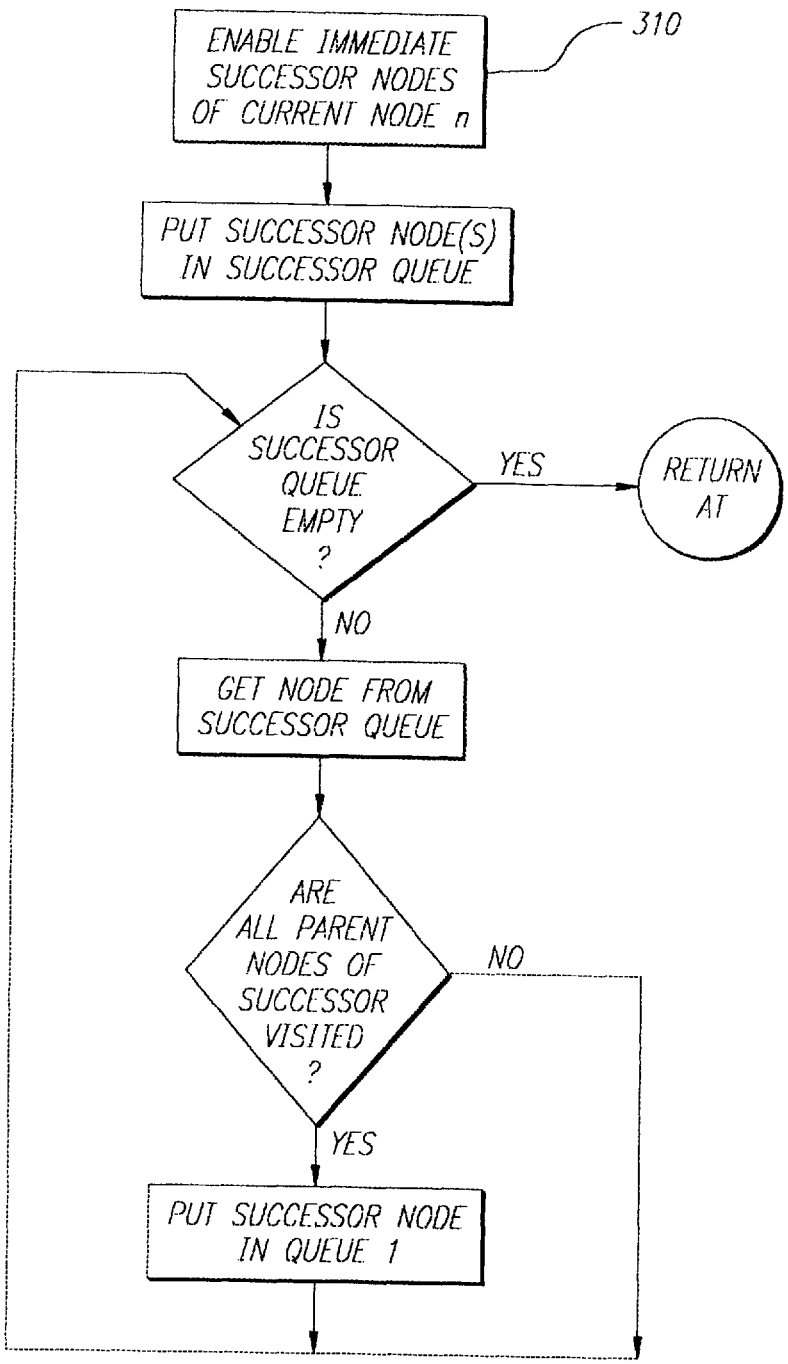
FIG. 6 is a procedural flow diagram of the immediate successor node enabling step of FIG. 4.
Figure 11:
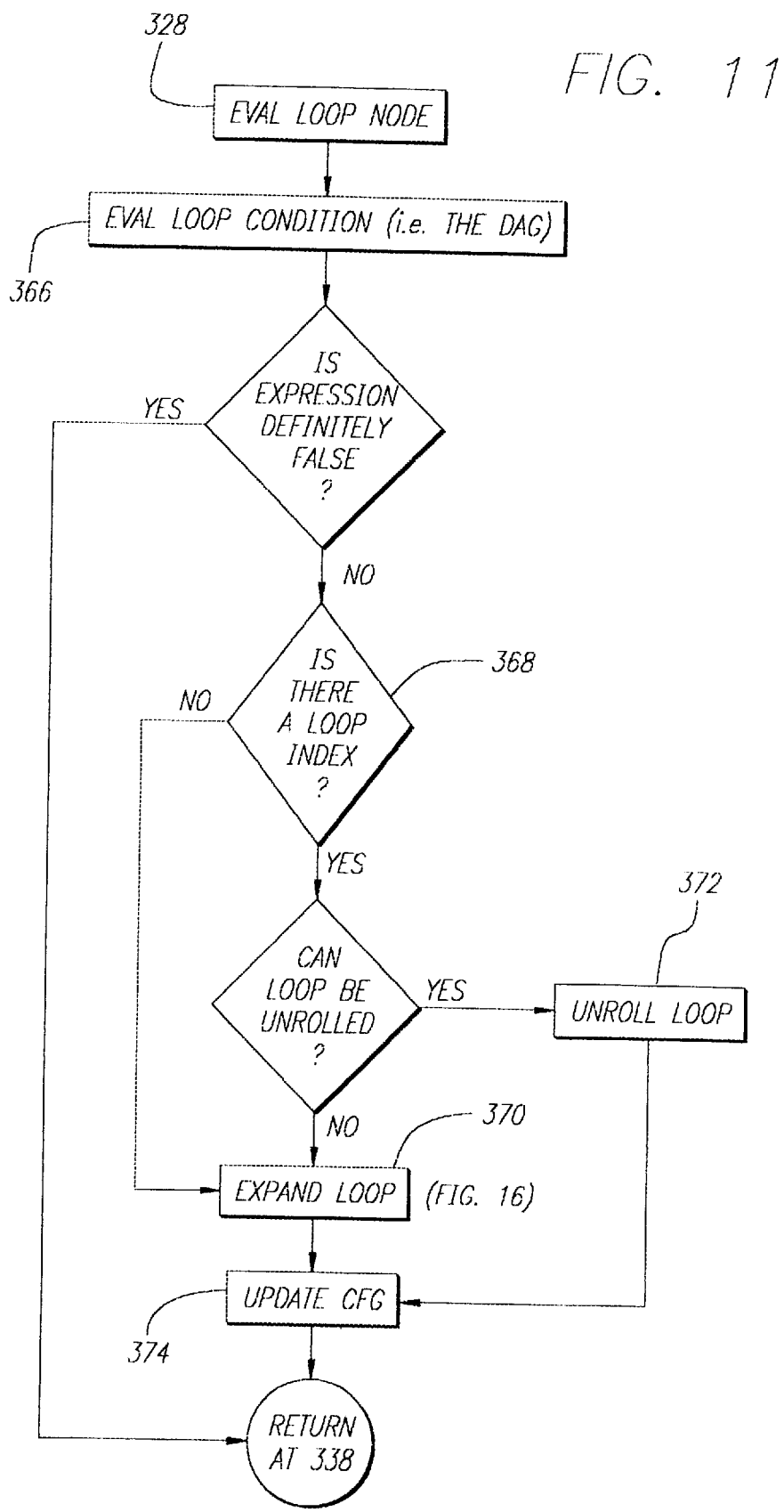
FIG. 11 is a detailed procedural flow diagram of the loop node evaluation step of FIG. 5.

If current node n is a loop node, control is transferred to the evaluate loop node procedure 328. A more detailed procedural flow for procedure 328 is illustrated in FIG. 11. Procedure 328 first evaluates the loop condition specified by loop node n at block 366. If the expression representing the loop condition is definitely false, processing returns to block 310 of procedure 30, shown in FIG. 4. The procedure represented in block 310, a more detailed illustration of which is shown in FIG. 6, determines along with procedure 30 which control node of the CFG will be processed next.

If the expression representing the loop condition is or can be true, procedure 328 of FIG. 11 proceeds to determine whether the loop can be unrolled, or whether it must be expanded. Loops which have finite numbers of iterations are typically loops which specify non-varying indexes. If the loop can be unrolled, control is transferred to block 372, which proceeds to unroll the loop in accordance with known loop-unrolling techniques. If the loop cannot be unrolled, control is transferred to the expand loop routine 370.

Figure 16A:
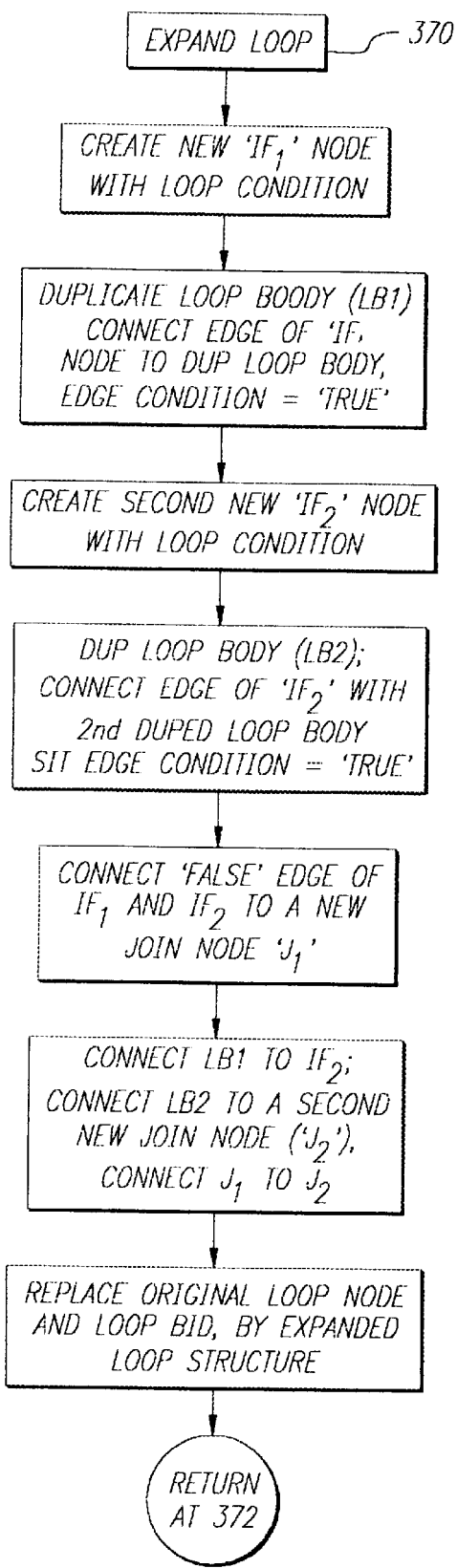
FIG. 16(a) is a detailed procedural flow diagram of the expand loop step of FIG. 11.
Figure 16B:
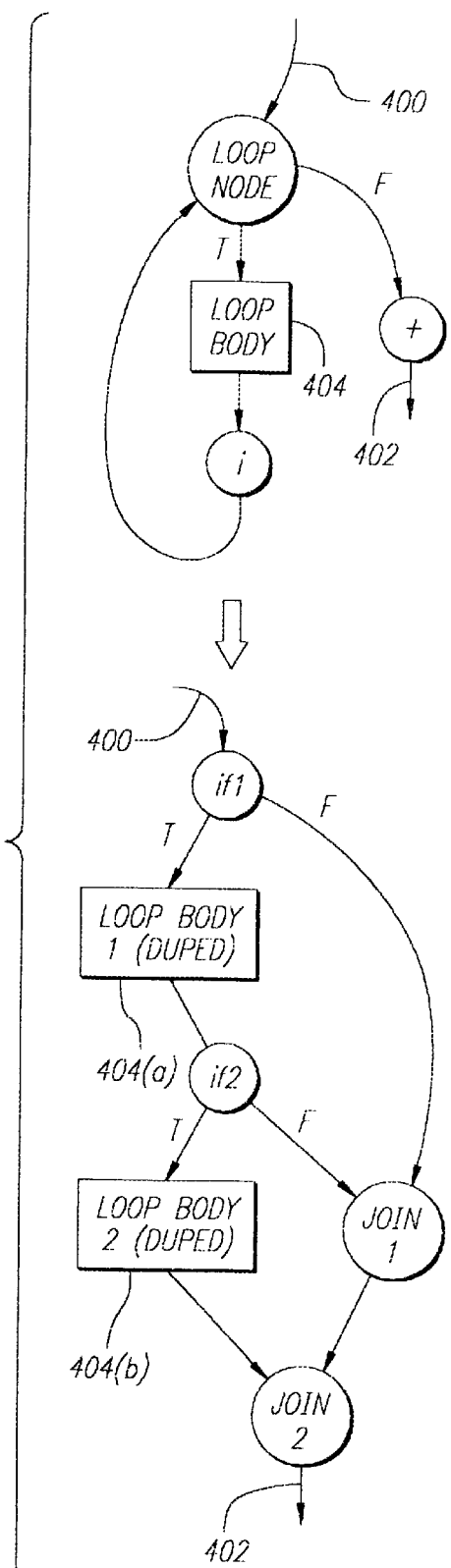
FIG. 16(b) is a diagram of the transformation of the unrollable loop into an expanded loop according to the procedure of FIG. 16(a).

A more detailed of the expand loop procedure 370 is illustrated in FIG. 16a. FIG. 16b illustrates the transformation of the unrollable loop into an expanded loop in accordance with the procedure described in FIG. 16a.

The unrolled or expanded loop is then substituted into the current CFG being evaluated. Control is then transferred back to the procedure of block 310 of FIG. 4 for determination of the next node to be evaluated.

Figure 12:
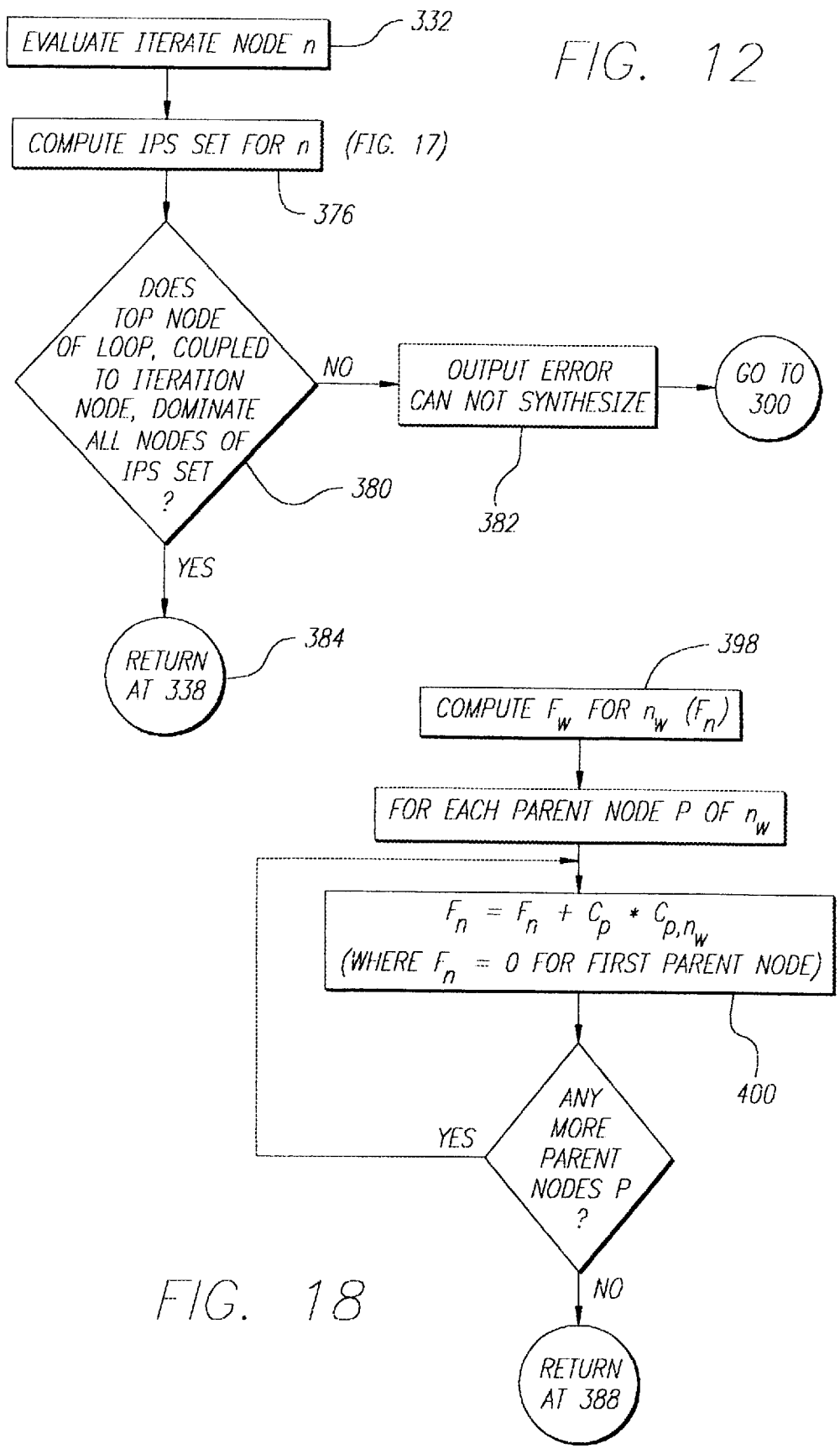
FIG. 12 is a detailed procedural flow diagram of the iterate node evaluation step of FIG. 5.

If the current node n is an iterate node, processing continues at block 332 representing the evaluate iterate node procedure. A more detailed illustration of the evaluate iterate node procedure 332 is shown in FIG. 12. Processing continues at block 376, where the IPS set for the current iterate node n is calculated in accordance with the compute IPS procedure illustrated in FIG. 17.

Figure 17:
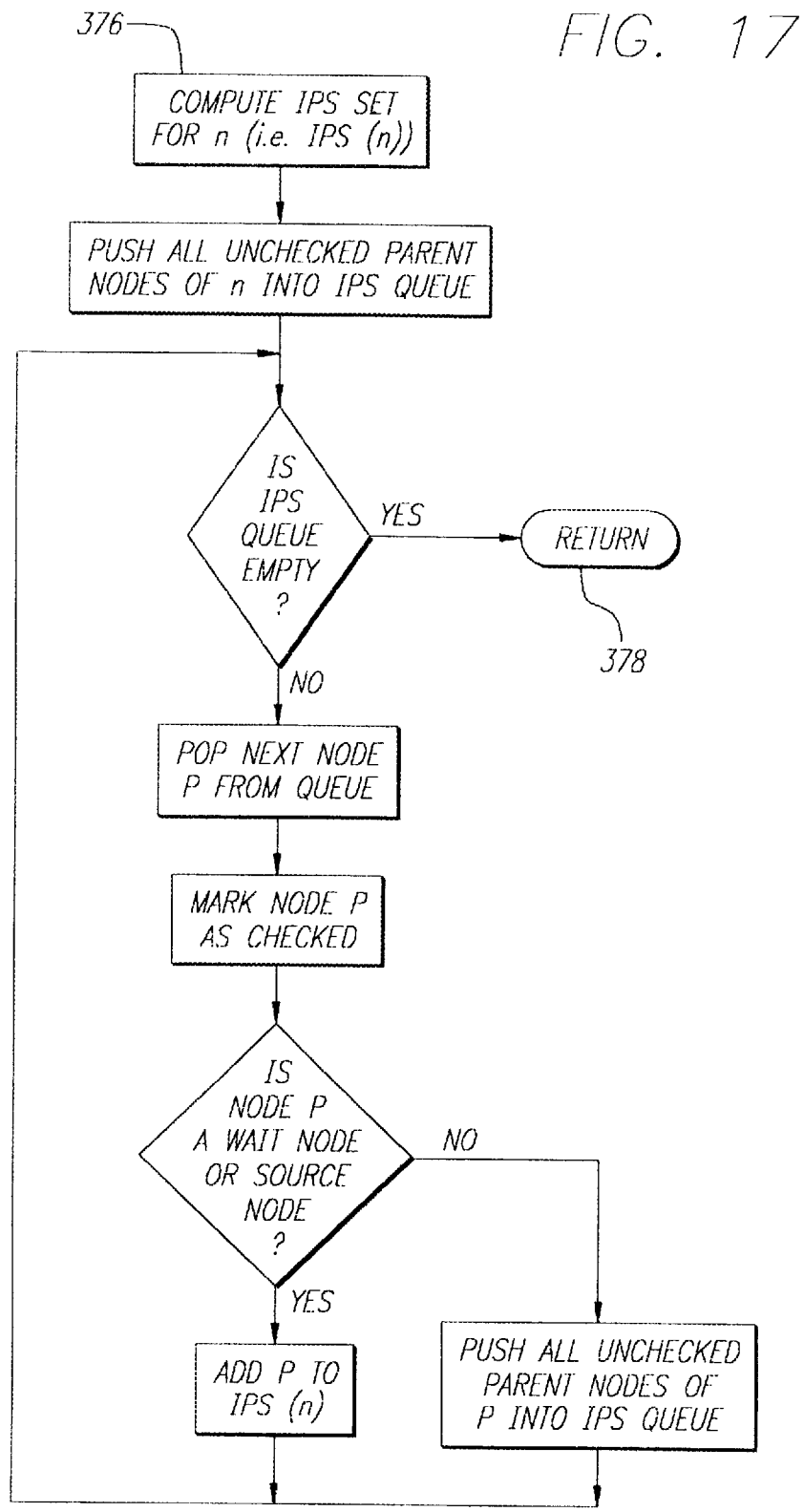
FIG. 17 is a detailed procedural flow diagram of the computation step of implicit previous states of node n of FIG. 12.

Procedure 376 as illustrated in FIG. 17 discloses an implementation for calculating the implicit previous state IPS set of nodes for n. Once IPS(n) has been computed for the current iterate node n, Block 380 determines whether the top node of the loop with which the current iteration node n is associated, dominates all nodes of the IPS(n) set. If it does not, an error message is output to the user indicating that this particular behavior cannot be synthesized in accordance with the method of the present invention, and control is returned to Block 300 of Procedure 30 (FIG. 4), which proceeds to the next CFG which is a candidate for extraction of implicit sequential behavior. If all nodes of IPS(n) are dominated, processing is returned to Block 310 of Procedure 30 to determine the next node to be evaluated.

Figure 14:
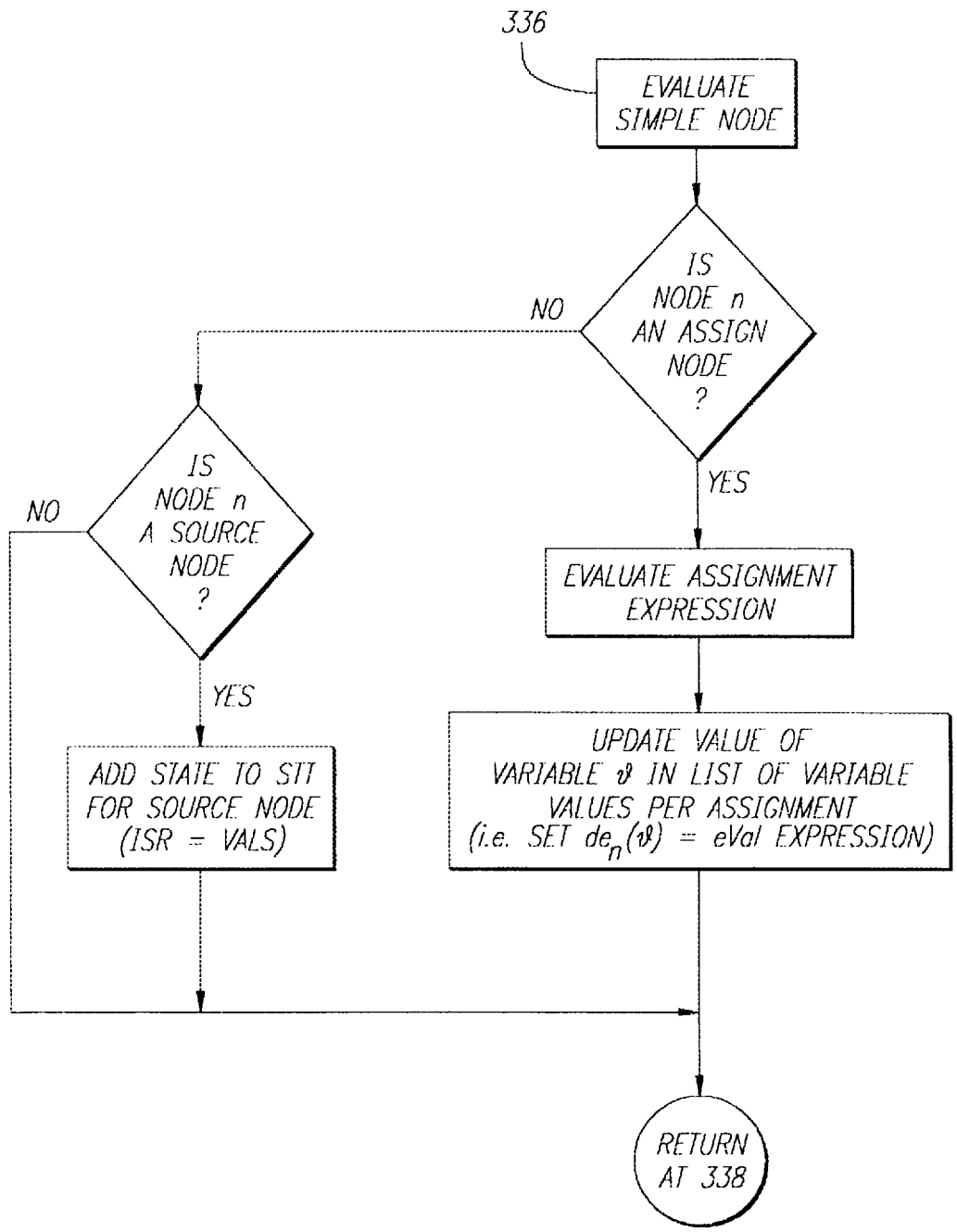
FIG. 14 is a detailed procedural flow diagram of the simple node evaluation step of FIG. 5.

If the current node n is a simple node processing continues at Block 336 of evaluate node Procedure 308 (FIG. 5). A more detailed illustration of the evaluate simple node Procedure 336 is shown in FIG. 14. If simple node n is an assigned node, the assignment expression is evaluated and the value of variable v, which is equated with the assignment expression, is updated with a new evaluated expression in accordance with the above-noted equation 4. If simple node n is not an assigned node, but is a source node, a state is added to the STT for the source node. This involves assigning a value to the ISR for the source node, which we define as "$val_s$. If simple node n is neither an assigned node nor a source node, control is returned to Block 310 of Procedure 30 to determine the next node to be evaluated. No further updating of variables v is necessary, as they have already been propagated to the current node n by the compute signal values routine 320 (FIG. 8).

Figure 13:
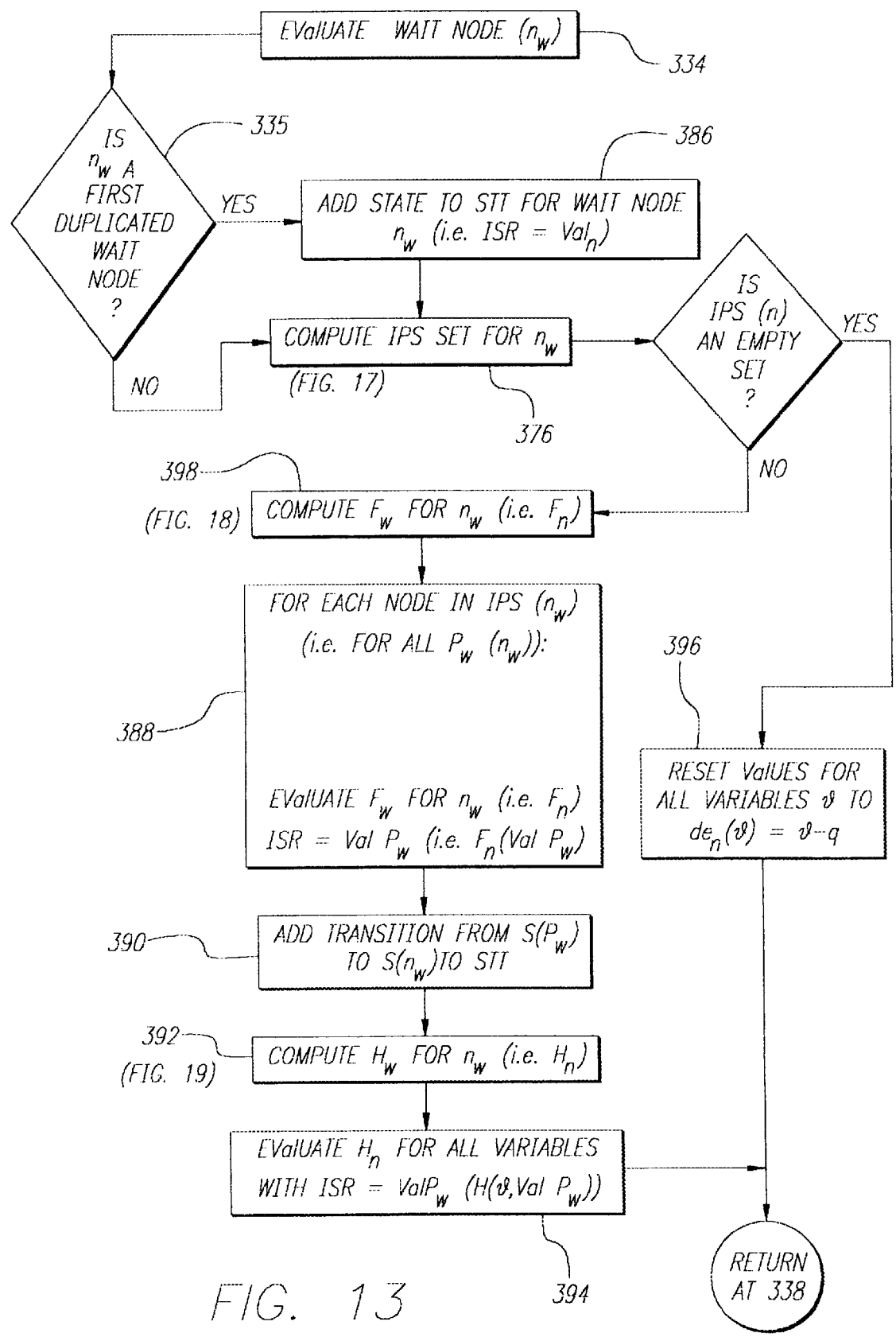
FIG. 13 is a detailed procedural flow diagram of the wait node evaluation step of FIG. 5.

If the current node n is a weight node, processing continues at Block 334 representing the evaluate weight node routine. A more detailed illustration of the evaluate weight node procedure 334 is illustrated in FIG. 13. Decision Block 335 of Procedure 334 determines whether current weight node $n_w$ is a first duplicated weight node created by the evaluate loop node routine 328. If it is, a state is added to the STT for current weight node $n_w$. This process also involves the assignment of a value defined as $val_n$ to the ISR. If the current node $n_w$ is a second duplicated weight node of an expanded loop, no state is added to the STT and control proceeds to Block 376. At Block 376, a new IPS set for current weight node $n_w$ is calculated in accordance with Procedure 376 (FIG. 17). The computation of the IPS set for weight node $n_w$ amounts to a determination of any other states thus far identified from which the state in the STT for the current weight node $n_w$ can be reached (i.e., any known transitions from previously identified states to the state represented by the current weight node).

If the IPS($n_w$) is an empty set, the values for all variables v at the current node $n_w$ are re-set to a value assigned at a previous state (i.e., $de_n(v)=v\_q$). Control is then return to Block 310 of Procedure 30 (FIG. 4) for determination of the next node of the current CFG to be evaluated. If the IPS set is not empty, control is transferred to Block 398 which calls a procedure for computing a function $f_W$ for $n_W$ (i.e., $F_N$).

A more detailed procedure for calculating $F_N$ is illustrated in FIG. 18. Procedure 398 is quite similar to the process by which the node activation for other current nodes were determined by the compute node activation procedure 318 illustrated in FIG. 7. This procedure does in essence calculate the node activation for the weight state. In Block 388 the function $F_N$ is evaluated for each node in the IPS set by substituting for the variable ISR the value assigned to each of those nodes which are members of IPS. Put another way, because the nodes which are members of IPS comprise the set of all parent weight nodes of the current weight node $n_w$, a substitute for the variable ISR in the equation computed for the function $F_n$ with the assigned value for ISR for each of the parent weight nodes comprising the set IPS ($n_W$).

Each evaluated expression for $F_n$ for a particular parent weight node of the IPS set defines the condition for transition from the state associated with the parent weight node to the state associated with the current weight node. Block 390 adds each of these expressions to the state transition table (STT) to define the transition which it represents.

Figure 19:
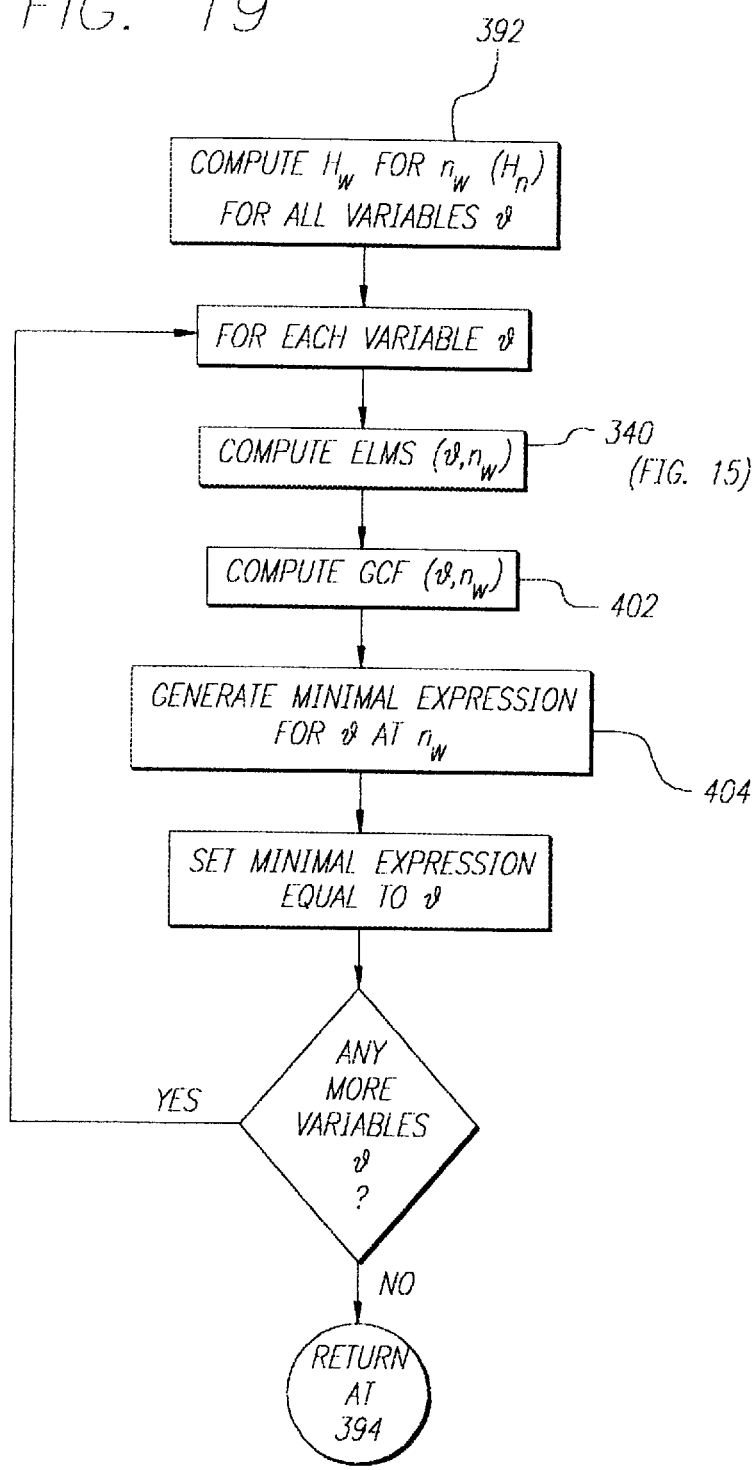
FIG. 19 is a detailed procedural flow diagram of the $H_w$ computation step of FIG. 13.

Block 392 then calls a procedure to compute a function $H_W$ for the current weight node $n_W$ (i.e., $H_N$). A more detailed procedural flow for Procedure 392 is illustrated in FIG. 19. As illustrated by FIG. 19, the function $H_N$ is computed for each variable v using the same techniques for generating the minimal expression for the value of v at weight node $n_W$, as was used to calculate the minimal expression for variable v at a join node.

Once the function $H_N$ has been computed for all variables v in accordance with Procedure 392, control is turned to Block 394 at which point all of the computed expressions for $H_N$ are evaluated by substituting the variable ISR with the value assigned to ISR for each of the parent weight nodes comprising the set IPS ($n_W$). These evaluated expressions are then included in the STT—each in association with the state transition between the state assigned to each parent weight node of IPS set to the current weight node. Control is then returned to Block 310 of Procedure 30 (FIG. 4), which determines which of the remaining unvisited control nodes of the current CFG will be evaluated next.

Figure 20B:
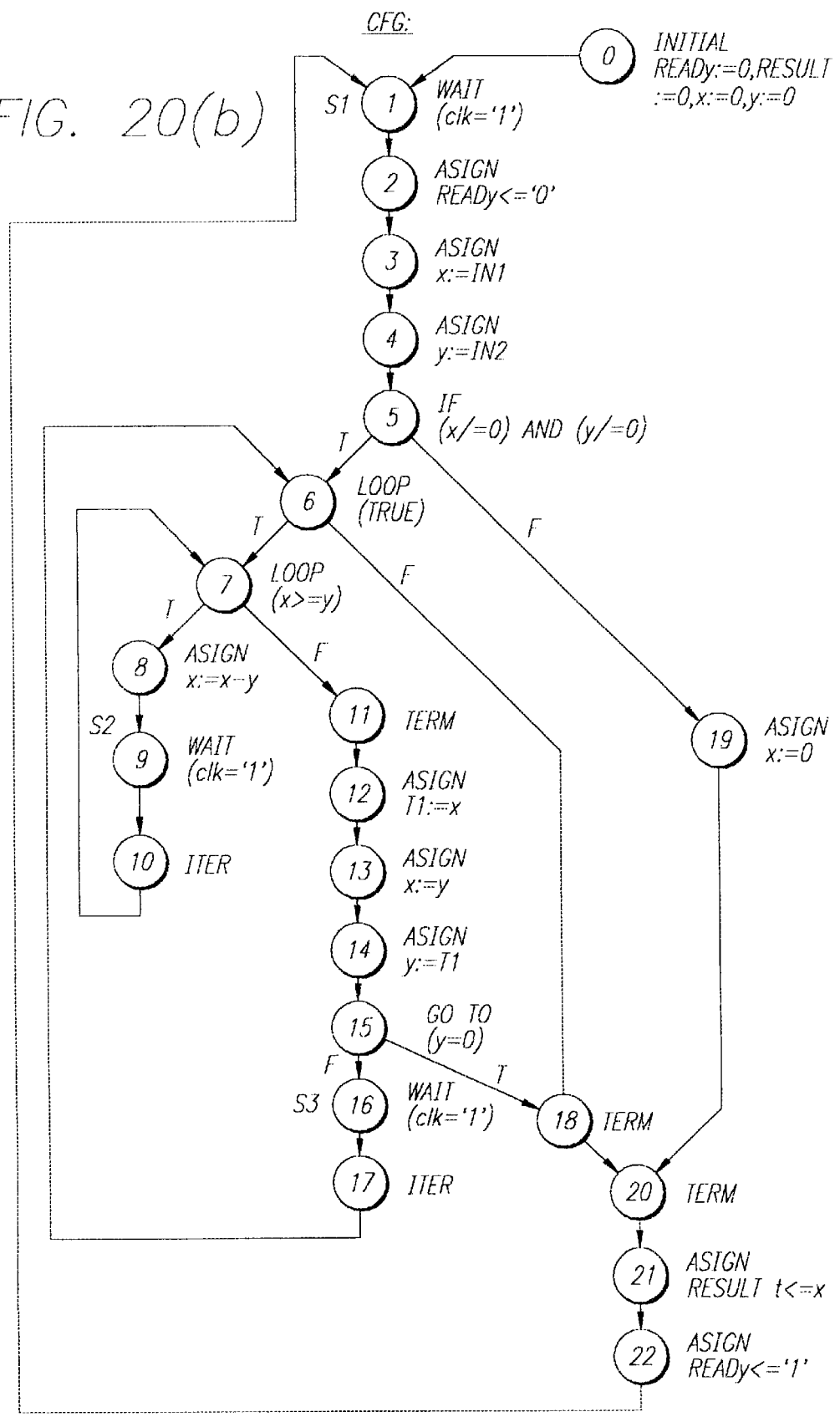
FIG. 20(b) is a control flow graph for the process of FIG. 20(a).

FIG. 20(*a*) illustrates a process exhibiting the requisite characteristics for permitting extraction of its implicit sequential behavior. The process calculates the greatest common denominator between two inputs in one and in two.

FIG. 20(*b*) illustrates a CFG for the process of FIG. 20(*a*). FIG. 20(*c*) illustrates a skeleton STT which shows the three states (S1, S2 and S3) which correspond to weight nodes 1, 9, and 16. Below each state are indicated the conditions which must be extracted from the CFG to define the transition from that state to each of the other states.

FIG. 20(*d*) shows the extracted expressions defining the conditions for each of the transitions. Line 500 defines the expressions for those variables v which provide conditional inputs to the combinational logic block 104 of FIG. 1 to permit the transition between state S1 and state S2. Of course, one of the conditions is that the ISM is in State 1 prior to the transition. Lines 502 of STT define the values that FSM outputs are to assume upon the transition from state S1 to state S2. Likewise, lines 504 define variables which provide conditional inputs for the transition from state S1 to S3. Lines 506 define the values of variables which provide outputs from the FSM once the transition has occurred. FIG. 20(*e*) illustrates a simplified STT for the process of FIG. 20(*a*).

Figure 21B:
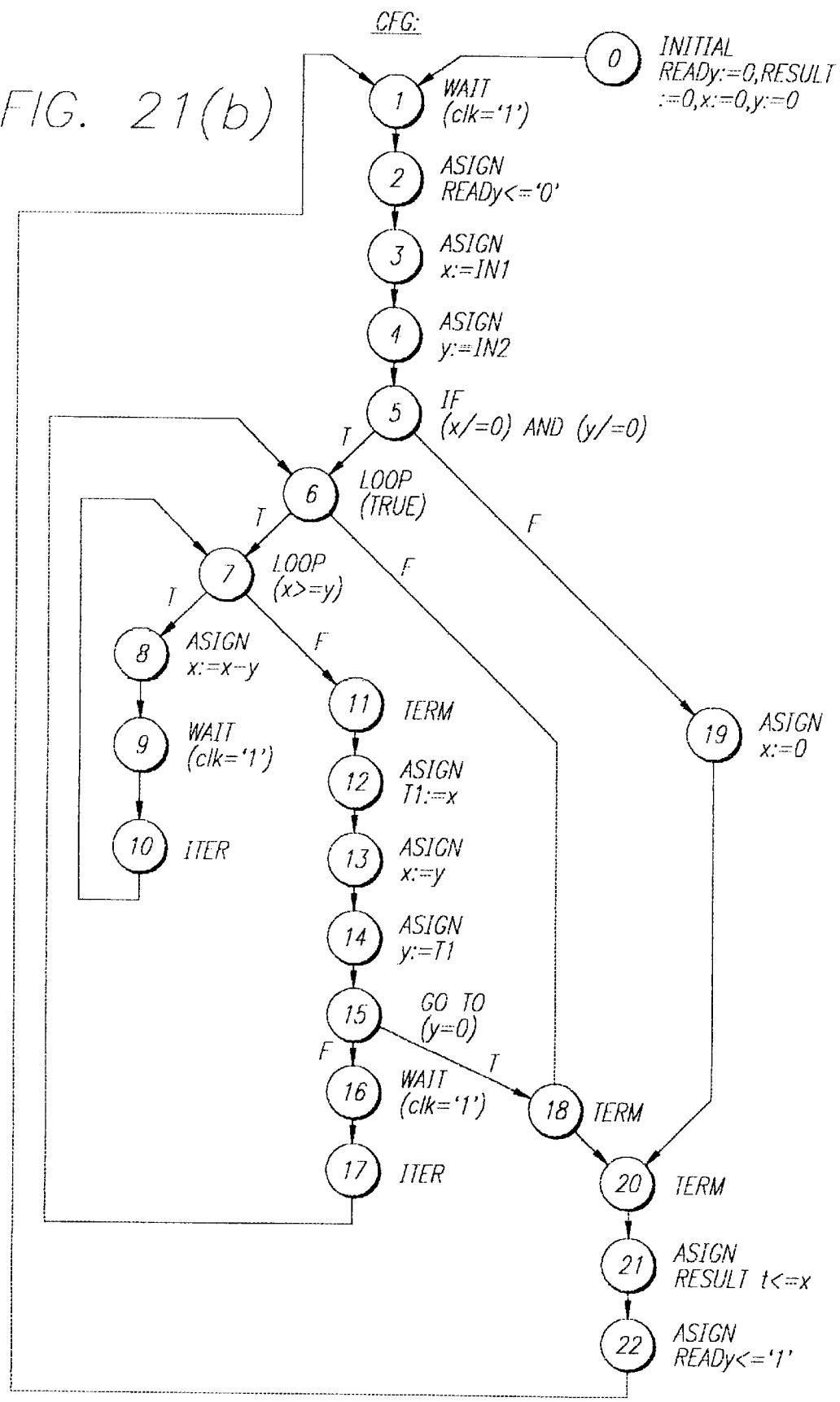
FIG. 21(b) is a control flow graph for the process of FIG. 21(a).

FIG. 21(*a*) illustrates the same process written in Verilog. FIG. 21(*b*) is a CFG generated from the Verilog version of the process as shown on FIG. 21(*a*). The method of the present invention can be used to infer the same state transition table from Verilog as it does from the VHDL version of the process shown in FIG. 20(*a*).

FIG. 22 illustrates a hardware implementation of the FSM which is generated from the STT of FIG. 20(*e*).

For additional technical background concerning the extraction of implicit sequential behavior, reference can be made to Giomi; *Finite State Machine Extraction from Hardware Description Languages*, attached hereto as Appendix A.

APPENDIX A

Finite State Machine Extraction from Hardware Description Languages

Jean-Charles Giomi

COMPASS Design Automation, Inc.
1865 Lundy Avenue, MS 30
San Jose, CA 95131, FAX: (408) 434-7981

Abstract --- This paper presents techniques to extract finite state machine (FSM) descriptions from sequential behaviors described in hardware description languages (HDL). Sequential behaviors can be described with an explicit state register which is assigned next state values. The extraction of these explicit sequential behaviors is based on the extraction of (value,condition) pairs from directed acyclic graphs. In addition, hardware description languages provide constructs, such as wait statements, that permit the descriptions of implicit sequential behaviors. Implicit sequential behaviors are extracted by a path-directed technique applied on a directed, cyclic, non-series/parallel control flow graph with embedded data flow graphs.

I. INTRODUCTION

Figure 1:
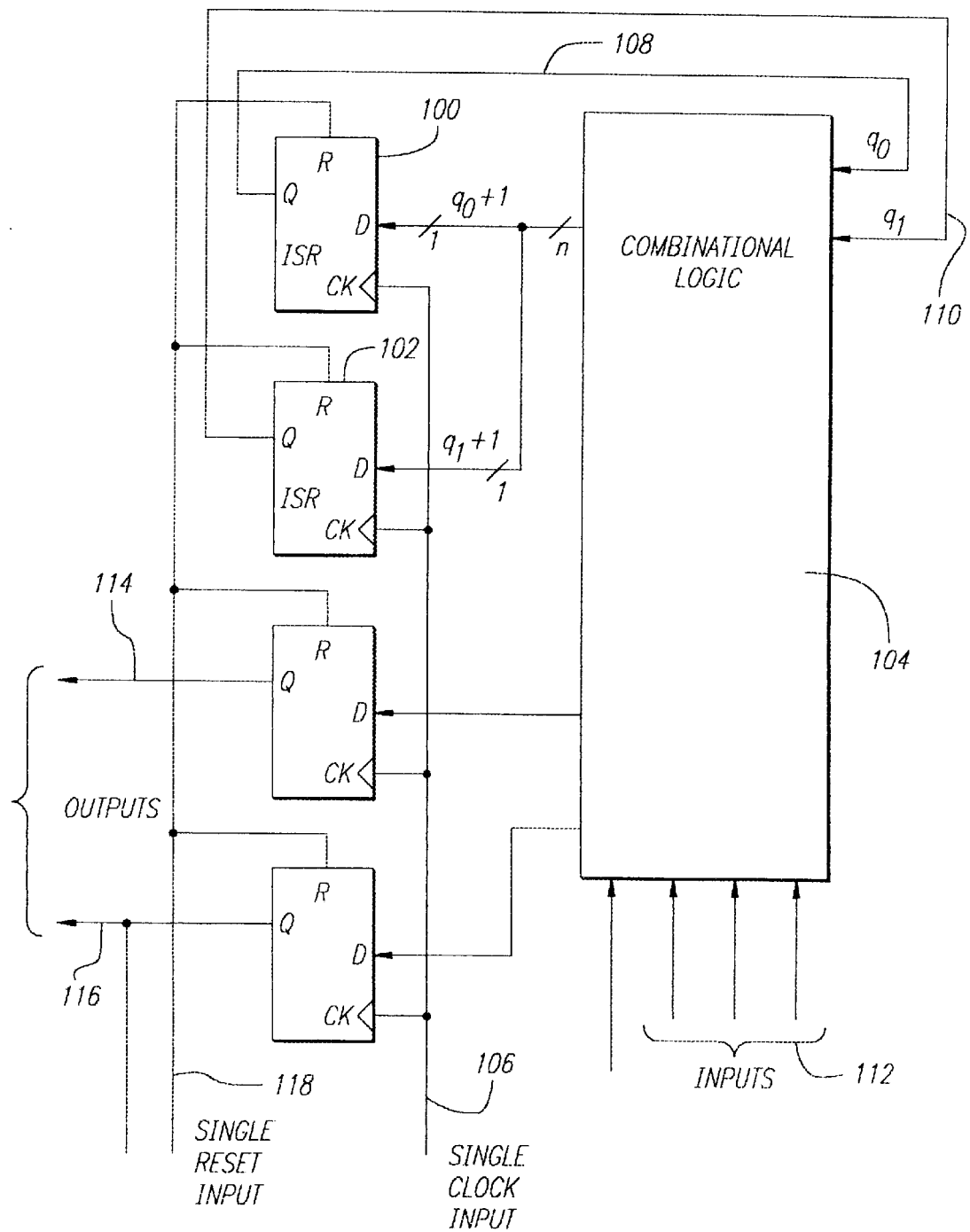
FIG. 1 is a diagram of a general finite state machine architecture.

Sequential behaviors can be inferred in many different ways in hardware description languages, such as VHDL [1] or Verilog [2]. First, sequential behaviors can be described explicitly with a state register which holds the current state value. This is typically described in an HDL description with a combinational block defining the next state and a sequential block assigning the next state value to the state register. In addition, sequential behaviors can be inferred from an HDL description using statements that allow a process to suspend its execution until an event occurs. This is possible in VHDL and Verilog with the use of VHDL wait statements or Verilog event control statements. Figure 1 shows a VHDL example computing the greatest common divisor using three wait statements.

One restriction is to extract only sequential HDL behaviors that can be implemented by a finite state machine (FSM) architecture. An FSM architecture is commonly defined with a combinational logic block which defines the next state value. This block depends on the current state and on state machine primary inputs. State machine primary outputs can depend on only the current state (MOORE machine) or the current state and primary inputs (MEALY machine). Note that state machine primary outputs can be either combinational, registered, or latched. Finally, the next state value is assigned to a unique state register at a given unique clock edge. This restriction disables the extraction of implicit sequential behaviors that are not sensitive to a unique clock edge. Implicit state machine primary outputs are only registered since they must be defined within a process using multiple wait statements sensitive to one clock edge.

Explicit sequential HDL behaviors can be mapped to a synchronous state machine architecture if the state register is assigned the next state value at a unique clock edge. The next state should be described by a combinational process or within the clocked process which defines the state register. Explicit state machine outputs can be either combinational, registered, or latched.

Loop constructs are represented by cycles in a control flow representation. When loop bounds are evaluated to constants, loop unrolling techniques can be applied to unroll loop constructs in order to eliminate cycles in the control flow graph. For loop constructs with non-constant bounds, cycles in the control flow graph can infer some behaviors that cannot be mapped to a synchronous state machine architecture. An additional restriction is that any remaining cycles derived from non-unrollable loop constructs should contain at least a wait node in order to correspond to state transitions.

The techniques presented in this paper extract implicit and explicit sequential behaviors from a directed, cyclic, non-series/parallel control flow graph that can be implemented by a synchronous state machine architecture. Prior work has been done on extracting combinational logic from hardware description languages like V [3], HardwareC [4], and CHDL [5]. Some other work has been done on extracting FSM descriptions from specific FSM languages like CUS [6] and DIADES [7]. However, none of those studies handle the extraction of sequential logic from the most general, cyclic, non-series/parallel control flow graphs derived from hardware description languages, such as VHDL or Verilog.

II. PROBLEM DESCRIPTION

HDL descriptions are first parsed by HDL parsers that perform lexical and syntactic analysis. Each HDL behavior is represented by a control-flow graph representation with embedded data-flow information.

Figure 2:
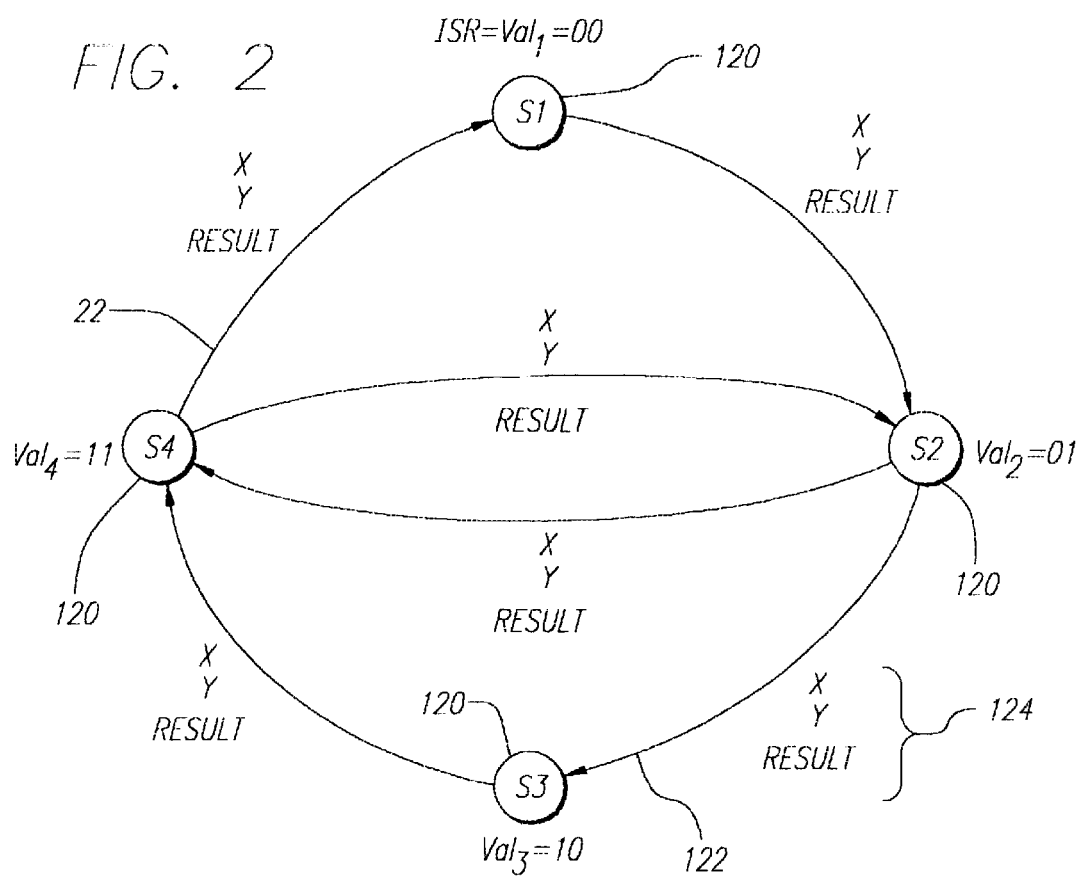
FIG. 2 is a diagram of a state machine using the general finite state machine architecture of FIG. 1.

The control flow is represented by a directed graph $G_{CF}=(V,E)$ in which each control node v of V represents control operations derived from the initial description constructs, such as conditionals (if, case), assignments, iterations (loop), subprogram calls, and wait statements. The edges specify the precedence relation between control nodes. This directed control-flow graph $G_{CF}$ has one unique entry node called source node and one unique exit node called sink node. The nodes representing assignments, subprogram calls, and wait statements have a unique incoming edge and a unique outgoing edge. Subprogram calls are represented by specific nodes which define control-flow subgraphs describing subprogram bodies. Nodes with multiple outgoing edges (resp. incoming edges) are called fork nodes (resp. join nodes). The control flow graph $G_{CF}$ contains cycles to represent looping constructs. The loop node activates the loop body if its condition is evaluated to be true. The iteration node re-invokes the loop by activating the feedback edge. The terminate node exits the loop body. Figure 2 shows how processes and loop constructs are represented in the control flow graph for the GCD3 example of figure 1. All statements are first being represented in the control flow graph with embedded data-flow information. The control flow graph is a strongly connected directed graph. Therefore, for any control node n, there is a directed path from the source node to node n.

The data flow is represented by a directed acyclic graph $G_{DF}=(V,E)$ derived from the syntax-directed analysis. Each leaf node of the data-flow graph $G_{DF}$ is a constant value, signal, or variable. Other intermediate nodes of the graph represent data operations. Note that a data operation can be a boolean operation (and, or, not, etc.), a register-transfer level operation (+,-,*,mod,div,shl,shr,etc.) or a conditional operation (if,case). Directed acyclic graphs are also used to represent the data expression of any variable at any given node of the control flow graph.

Compiler optimizations [8] are performed using data-flow analysis techniques such as common sub-expression elimination, dead-code elimination, and life-variable analysis. It is important to know which local variables in a process (or a block) are still live at each node of the control flow graph to extract optimally finite state machine representations.

The problem consists of extracting, from a directed control flow graph, a finite state machine description $FSM(I,O,G_{STG})$, where I is the set of primary inputs, O is the set of primary outputs, and where $G_{STG}$ is a state transition graph (STG). An STG is denoted by a directed graph $G_{STG}(V,E,L(E))$, where V is the set of vertices corresponding to the set of states, E is the set of edges that corresponds to the state transitions (noted $e_{i,j}$ for an edge from node i to node j), and L(E) is a set of labels attached to each edge. Each label carries the information of the values of inputs that causes the transition (noted $t_{ij}$ for edge $e_{i,j}$) and the values of the primary outputs corresponding to that transition (noted $o_{i,j}(v)$ for any $v \in O$). State transitions and output expressions are represented by the directed acyclic graphs representing data-flow dependency.

III. IMPLICIT STATE MACHINE EXTRACTION

The technique to extract an STG from a control flow graph $G_{CF}$ consists of evaluating all executable paths between wait nodes. Colon-Bonnet et al. [5] describe techniques to compute minimal data expressions which represent the current value of a given variable at every control node in a directed, non-series/parallel, acyclic control flow graph. The work presented in this paper extends their techniques in order to extract a state transition graph with minimal data expressions from a directed, non-series/parallel, cyclic control flow graph.

*A. Definitions*

The node activation is an expression associated to each node n noted $c_n$ that is true when the node n is active. In addition, the edge activation is an expression $C_{i,j}$ associated to each edge (between node i and j) which is true when the control is passed from node i to node j. Node activation is defined recursively as follows:

For w a wait or source node: $\quad c_w = 1 \quad$ (1)

For other node i: $\quad c_i = \sum_{j \in PN(i)} c_j \cdot C_{j,i} \quad$ (2)

with parent nodes PN(i):

Edge activation $C_{i,j}$ is true for all edges from any node which is not a fork node, a wait node, or the source node. For edges from fork nodes, the expression representing the predicate or case selector determines that exactly one of the edge activation $C_{i,j}$ is true and all others are false. For the source node or any wait node w, the expression representing the edge activation $C_{w,j}$ is set to (ISR=val$_w$). ISR represents an implicit state variable and val$_w$ represents the implicit state value for node w. A directed path from node i to node j of control flow graph $G_{CF}$ is said to be "activated" if no edge activation of that path is evaluated to be false.

The data expression of any live variable v at any control node n noted $de_n(v)$ is defined recursively as follows:

$$de_{sc}(v) = IV(v) \quad (3)$$
$$de_w(v) = v\_q \quad (4)$$
$$de_i(v) = e_i(\text{local expression}) \quad (5)$$
$$de_i(v) = \sum_{j \in PN(i)} \frac{c_j \cdot C_{j,i}}{c_i} de_j(v) \quad (6)$$

Equation (3) shows that the data-expression of variable v at the source node is set to its initial value. Equation (4) shows that the data-expression of variable v at a wait node is reset to an implicit variable v_q which corresponds to the previous value of v set in prior states. Equation (5) shows the data-expression of variable v at a node that sets that variable. Equation (6) shows that the data-expression of variable v, at a node that does not set that variable, is the boolean sum of the values at each parent node anded with that parent node activation. Data-expressions of dead temporary variables at a node n are set to unknown values.

*B. Optimal Extraction of State Machine Description*

We first define the "Implicit Previous State" IPS of node n to be a set of ancestor wait nodes (could include the source node) that are individually closest in the direction opposite to the flow from node n in the control flow graph. First, if s is in IPS(n), then s is a wait node or the source node and there is at least one activated path from s to n that does not pass through a wait node.

To eliminate unnecessary control conditions in the data expression of any variable at any control node, an "Extended Level Maximal Set" ELMS for a cyclic control-flow graph is introduced as follows. Given a particular node n at which we want to know the data expression of a variable v, the ELMS(n,v) is the set of ancestors that are individually furthest in the direction opposite to the flow from node n in the control flow graph which has the following properties. First, if s is in ELMS(n,v), then the directed path from s to n is activated. Also, there is no activated path from node s to node n through any node m which is a wait node or at which there is an assignment to variable v. Furthermore, all activated paths from any node in IPS(n) to n pass through a member of ELMS. The data expression of variable v at node i can be minimally expressed as follows:

$$de_i(v) = \sum_{j \in ELMS(i,v)} c_j \cdot de_j(v) \qquad (7)$$

Since there are no nodes changing the variable v from ELMS(i,v) to node i, equation (7) shows that the data-expression of v at that node i is simply the boolean sum of the values at each node j in ELMS(i,v) anded with its node activation. Note that it is possible to factor the activation condition of the node that dominates node i and any node in ELMS(i,v) with respect to IPS(i). This dominator vertex is called Greatest Common Factor.

The expression of the node activation of a wait node represents the condition for which each implicit previous state reaches the implicit state of that node. Since the edge activation of an edge from a wait node w is an expression (ISR=val$_w$), we can define the following functions for each wait node w:

$$F_w(ISR) = \sum_{j \in PN(w)} c_j \cdot C_{j,w} \qquad (8)$$

$$H_w(ISR)(v) = \sum_{j \in ELMS(w,v)} c_j \cdot de_j(v) \qquad (9)$$

The extraction of state transition conditions ($t_{i,w}$) and state output expressions ($o_{i,w}(v)$) from the control flow graph corresponds to the evaluation of both functions $F_w$ and $H_w$ for every wait node w and is expressed as follows:

$$\forall i \in IPS(w) \quad t_{i,w} = F_w(val_i) \qquad (10)$$
$$\forall i \in IPS(w) \quad o_{i,w}(v) = H_w(val_i)(v) \qquad (11)$$

Equations (10) and (11) correspond to the substitution of variable ISR by the value val$_i$ in $F_w$ and $H_w$ for each node i in IPS(w). For each wait node w, state transition edges are added that correspond to activated paths from wait nodes in IPS(w) set to the current wait node w. Therefore, the STG is being built incrementally at each evaluation of any wait node. The FSM primary inputs are finally determined by the support of data expressions from every edge. Figure 3 shows the extracted state transition table for GCD3.

C. *Dealing with Control Flow Graph Cycles*

Any looping feedback is represented by an edge from an iteration node specific to an iteration construct. This introduces cycles in the control flow graph that must have at least a wait node. We call any cycle which does not have any wait nodes a zero-time cycle. Zero-time cycles must be detected during the extraction of the implicit state machine. The detection of zero-time cycles consists of checking that any activated directed path from loop node n to iteration node iter(n) passes through a wait node. This is based on determining the IPS of node iter(n) and checking that the loop node is a dominator vertex of all nodes in that set. To preserve the properties of the ELMS and IPS node sets, the activation of an iteration node iter(n) has the following properties:

$$C_{iter(n),n} = 1 \text{ and } \forall i \in PN(n) \quad C_{i,n} = 0 \qquad (12)$$
$$\forall w \in IPS(iter(n)) \; \forall i \in PN(w) \; C_{w,i} = 0 \qquad (13)$$

Equation (12) sets the feedback edge activation to the value true and the edge condition of the incoming edge to the loop node to the value false. This activates the directed path corresponding to the iteration step and deactivates the directed path corresponding to the initialization step. Eq (13) corresponds to set the edge condition from every wait node w in IPS(iter(n)) to false. This equation forces the termination of the loop body evaluation.

D. *Inferring FSM initialization state from HDL*

The synthesis of the inferred implicit initialization state requires the ability to synthesize power-on logic that can take specific values when circuit power is turned on. Most synthesis tools do not support this type of logic needed to synthesize the initial state. The inference of an asynchronous reset in VHDL processes using wait statements is very tedious. First, an outer loop is added to the process and initial reset statements are added before the loop. Then, each wait statement needs to be rewritten in order to check the reset condition and exit the outer-most loop if that condition is active. The control flow graph is checked if it describes an implicit state machine with asynchronous reset and is reduced to be handled by the previous techniques. Verilog provides a way to disable a block asynchronously with the disable statement. Another solution is to derive the initial state from the first wait statement executed at simulation time 0 and reset asynchronously the implicit state machine in that state when a user-defined reset signal is active.

IV. EXPLICIT STATE MACHINE EXTRACTION

An explicit sequential behavior is inferred in an HDL description with an explicit state register. Given the explicit register defining the state machine, the problem consists of extracting a finite state machine description from the data-expression of the next state value assigned to the state register on the clock edge. The data-expression of the next state "NSR" is expressed as a function of the state register "SR". We can define the following functions:

$$K(SR) = de_{sk}(NSR) \qquad (14)$$

$$M(SR)(v) = \sum_{j \in ELMS(sk,v)} c_j \cdot de_j(v) \qquad (15)$$

The extraction of state transition conditions ($t_{i,j}$) and state output expressions ($o_i(v)$) from the directed acyclic graph corresponds to the evaluation of both functions K and M with state values $val_i$ and $val_j$ for both state i and j and is expressed as follows:

$$t_{i,j} \oplus (K(val_i) = val_j) = 0 \quad (16)$$

$$o_i(v) = M(val_i)(v) \quad (17)$$

Equation (16) defines $t_{i,j}$ to be the condition for which $K(SR)$ is evaluated to $val_j$ in state $val_i$. Equation (17) defines state output data expressions in state i.

The state machine extraction technique relies on extracting pairs of value and condition (val,cond) from the directed acyclic graph $K(SR)$. The extraction is divided into two parts: explicit state value extraction and implicit state value extraction. The initial explicit state values are the values that are explicitly assigned to the state register. It is a subset of all the values to which the final expression of the state register can be evaluated. A list of pairs indicating explicit state values (including the reset state value) and conditions are generated first. The implicit state value extraction consists of extracting explicit state values from the state register DAG evaluated in a given state. The evaluation is accomplished by substituting, in the state register DAG, the state register with the state value of a given state. Constant folding optimization reduces the new DAG and implicit state values are now explicitly defined in the reduced DAG. Each pair of state value and condition (val,cond) evaluated in a given state S corresponds to a state transition from state S to state "val" under condition "cond". DAG satisfiability techniques are performed on any new state transition (val,cond) to eliminate any unexecutable state transitions. The STG is being built incrementally at each evaluation of the state register DAG in a given state.

V. ALGORITHMS

The control flow graph is being traversed by a breadth first search algorithm that evaluates each control node when all its activated parent nodes have been evaluated. The "Implicit Previous States" are determined for any wait node by a simple depth first search (DFS) in the opposite direction of the control flow. The computation of the "Extended Level Maximal Set" is based on a breadth first search (BFS) in the opposite direction of the control flow that starts from intermediate join nodes. For any live variable, any potential path to the IPS set is checked. The procedure "searchELMS", illustrated in Alg. 1, determine the ELMS of variable v at node n.

The substitution technique used in Eq. 8,9,16,17 is based on the evaluation of the substituted directed-acyclic graph in a topological bottom-up order to simplify each intermediate data-operation node.

The extraction of pairs of value/condition from a directed-acyclic graph (Eq. 15) used during explicit state machine extraction is based on a depth first search through the directed-acyclic graph. Each data-operation node is evaluated in a topological bottom-up order and the evaluation produces a list of pairs (val,cond). The evaluation of a constant v produces the following pair (v,1). The evaluation of an intermediate node n performing a function f produces pairs like $(v=f(v_1,..,v_n),c=c_1.c_2...c_n)$. An if node with condition C produces pairs like $(v=v_1,c=(c_1$ and $C))$ and $(v=v_2,c=(c_2$ and $($not $C)))$. A case node with selector S produces a pair like $(v=v_i,c=(c_i$ and $(S=i)))$.

```
procedure searchELMS(n,v : in; ELMS : out)
add n in queue
while (queue not empty) {
  pop i from the queue
  if (c_i = 0) or (v not set at i) or (i not wait node) {
    mark i as visited
  }
  if (i not visited) {
    add i to ELMS
    for each node j in PN(i) {
      if (all children nodes of j are visited) {
        add j in queue
        if (j is a fork node) {
          for each node k in CN(i) {
            remove k from ELMS
          }
        }
      }
    }
  }
}
```
Alg. 1. "searchELMS" procedure

VI. FINAL IMPLEMENTATION

The extracted finite state machine descriptions from both implicit and explicit sequential behaviors are state transition graphs supporting embedded datapath and memory operations. Note that additional datapath [9] and memory [10] control logic can be included in the extracted finite state machine descriptions. These finite state machine descriptions are translated to logic-level state transition tables. Each DAG is translated to a set of boolean covers more suitable for logic optimization [12]. The logic-level state transition table is optimally synthesized with a minimum number of non-equivalent states and an optimized state encoding [11]. There are obviously many advantages to extract FSM descriptions from a control flow graph with data-flow information rather than from a Boolean Network (generalized concept of standard cell netlist). First, DAG optimization can significantly reduce the extracted state transition graphs and therefore the final logic-level state transition table. The equivalent logic-level optimizations can be often very cpu intensive and not practical for medium to large FSM examples. Furthermore, the detection of inactivated control flow paths can prevent the creation of sequential logic false paths which are harder to eliminate at the logic level.

VII. CONCLUSIONS

New techniques have been presented for solving the problem of extracting state transition graphs from implicit and explicit HDL sequential behaviors. The formalism presented by Colon-Bonnet et al. [5] has been extended to handle cyclic control flow graphs. Future work will focus on formulating the inter-process communication between sequential behaviors in order to optimize the extraction of communicative finite state machines from hardware description languages.

```
entity gcd3 is
    port ( clk,rst    : in bit;
           in1,in2    : in integer range 0 to 15;
           ready      : out bit;
           result     : out integer range 0 to 15);
end gcd3;
architecture behavior of gcd3 is
begin
    process
        variable x,y,t1: integer range 0 to 15;
    begin
        wait until (clk='1'); -- state S1
        ready <= '0';
        x:=in1; y:=in2;
        if ((x/=0) and (y/=0)) then
            loop
                while (x>=y) loop
                    x:=x-y;
                    wait until (clk='1'); -- state S2
                end loop;
                t1:=x; x:=y; y:=t1;
                exit when (y=0);
                wait until (clk='1'); -- state S3
            end loop;
        else
            x:=0;
        end if;
        ready <= '1';
        result <= x;
    end process;
end behavior;
```

Fig. 1. Example GCD3 with 3 implicit states

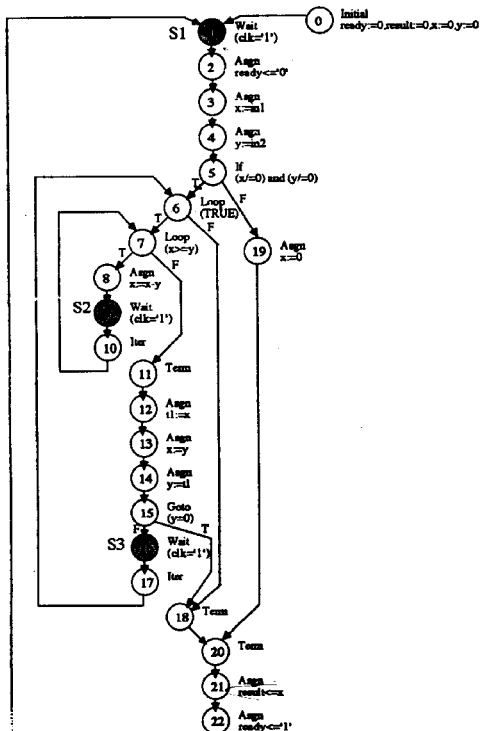

Fig. 2. Control flow graph for example GCD3

```
state S1
(in1/=0) and (in2/=0) and (in1>=in2) --> S2/S3,
    x <= in1-in2; y <= in2;
    result <= result_q; ready <= '0';
(in1/=0) and (in2/=0) --> S2/S3,
    x <= in2; y <= in1;
    result <= result_q; ready <= '0';
TRUE --> S1,
    x <= 0; y <= in2;
    result <= 0; ready <= '1';

state S2/S3
(x_q>=y_q) --> S2/S3,
    x <= x_q-y_q; y <= y_q;
    result <= result_q; ready <= ready_q;
(x_q/=0) --> S2/S3,
    x <= y_q; y <= x_q;
    result <= result_q; ready <= ready_q;
TRUE --> S1,
    x <= y_q; y <= x _q;
    result <= 0; ready <= '1';
```

Fig. 3. Final FSM representation for GCD3

REFERENCES

[1] IEEE Standard VHDL Language Reference Manual, IEEE Std 1076-1987/1993.

[2] Verilog Hardware Description Language Reference Manual, Version 2.0.

[3] R. Camposano and W. Rosenthiel, "Synthesizing Circuits from Behavioral Descriptions," *IEEE Trans. CAD*, vol. 8, pp. 171-180, Feb. 1989.

[4] D. Ku and G. De Micheli, "HardwareC: A Language for Hardware Design," technical report CSL-TR-90-419, Computer System Lab., Stanford Univ., Aug. 1990.

[5] G. Colon-Bonet, E.M. Shwarz, and D.G. Bostick, G.D. Hachtel, M.R. Lightner, "On Optimal Extraction of Combinational Logic and Don't Care Sets from Hardware Description languages," in *ICCAD*, pp. 308-311, Nov. 1987.

[6] A. Rotman and R. Ginosar, "Control Unit Synthesis from a High-Level Language," *IEEE Trans. CAD*, vol. 9, pp. 162-167, Jan. 1993.

[7] M. A. Perkowski and J. Liu, "Generation of finite state machines from parallel program in DIADES," in Proc. Int. Sym. Circuits and Systems, pp. 1139-1142, 1990.

[8] A.V. Aho, R. Sethi and J.D. Ullman, *Compilers: Principles, Techniques and Tools*. Reading, MA: Addison-Wesley, 1986.

[9] M. Mahmood, B. Sharma, C. Kingsley, "A Datapath Synthesizer for High-Performance ASICs," in *CICC*, pp 5.5.1-5.1.4, Boston, MA, May 1992.

[10] N. V. Zanden, "Synthesis of Memories from Behavioral HDLs", *IEEE ASIC Conference 1994*, pp 71-74, Rochester, NY, Sept. 1994.

[11] T. Villa and A. Sangiovanni-Vincentelli, "NOVA: state assignment of finite state machines for optimal two-level logic implementation," *IEEE Trans. CAD*, vol. 9, pp. 905-924, Sept. 1990.

[12] R. Brayton, R. Rudell, A.S. Vincentelli, and A. Wang, "MIS: A multiple-level logic optimization system," *IEEE Trans. CAD*, vol. 6, pp. 1062-1081, Nov. 1987.

What is claimed is:

1. A method of extracting finite state machine (FSM) circuit architecture in the form of a structural netlist from implicit sequential behavior specified in a hardware description language (-HDL) circuit description, said method comprising the steps of:

Parsing the HDL description to create a plurality of control flow graphs (CFGs) by performing lexical and syntactic analysis for each process of the HDL description;

Identifying one or more of said plurality of CFGs which specify implicit sequential behavior incorporating one or more wait nodes each of which are sensitive to the same unique clock edge;

Evaluating each of the nodes of the identified CFGs using a breadth first search, said step of evaluating further comprising the steps of:

Assigning each of the wait nodes to a state;

Evaluating all executable paths between each of the wait nodes;

Building a state transition table (STT) based on said step of evaluating; and

Generating a structural netlist based on the STTs.

* * * * *